United States Patent
Yano et al.

[11] Patent Number: 6,045,626
[45] Date of Patent: Apr. 4, 2000

[54] SUBSTRATE STRUCTURES FOR ELECTRONIC DEVICES

[75] Inventors: Yoshihiko Yano, Kanagawa; Takao Noguchi, Chiba, both of Japan

[73] Assignee: TDK Corporation, Tokyo, Japan

[21] Appl. No.: 09/102,568

[22] Filed: Jun. 23, 1998

[30] Foreign Application Priority Data

Jul. 11, 1997 [JP] Japan ..................................... 9-202409
Jan. 12, 1998 [JP] Japan ................................. 10-016368
Jun. 1, 1998 [JP] Japan ................................. 10-167686

[51] Int. Cl.$^7$ .................................................. H01L 21/20
[52] U.S. Cl. .......................... 148/33.4; 148/33; 117/950; 117/952; 438/479; 438/493
[58] Field of Search ........................... 148/33, 33.3, 33.4; 117/84, 88, 89, 950, 952; 438/406, 479, 493

[56] References Cited

FOREIGN PATENT DOCUMENTS

| | | |
|---|---|---|
| 8-109099 | 4/1996 | Japan . |
| 8-264894 | 10/1996 | Japan . |
| 9-045960 | 2/1997 | Japan . |
| 9-45960 | 2/1997 | Japan . |

OTHER PUBLICATIONS

Nikkei Electronics, No. 674, pp. 79 to 100, Oct. 21, 1996.
A. Watanbe, et al., Journal of Crystal Growth, vol. 128, pp. 391 to 396, "The Growth of Single Crystalline GaN on a Si Substrate Using AlN as an Intermediate Layer", 1993.
Tetsuya Takeuchi, et al., Journal of Crystal Growth, vol. 115, pp. 634 to 638, "Growth of Single Crystalline GaN Film on Si Substrate Using 3C–SiC as an Intermediate Layer", 1991.
Koji Hirosawa, et al., Electronic Communications Society, CPM92 1–13, pp. 45 to 50, "The Growth of a Single Crystalline GaN Film on a Si Substrate by MOVPE Using AlN as an Intermediate Layer", 1992 (with English Abstract).
Mizuho Morita, et al., Japanese Journal of Applied Physics, vol. 20, No. 3, pp. L173 to L175, "Aluminum Nitride Epitaxially Grown on Silicon: Orientation Relationships", Mar. 1981.

*Primary Examiner*—Chandra Chaudhari
*Assistant Examiner*—Keith Christianson
*Attorney, Agent, or Firm*—Oblon, Spivak, McClelland, Maier & Neustadt, P.C.

[57] ABSTRACT

A substrate structure includes a single crystal Si substrate and a surface layer, with a buffer layer interleaved therebetween. The buffer layer includes at least one of an R—Zr family oxide thin film composed mainly of a rare earth oxide and/or zirconium oxide, an $AMnO_3$ thin film composed mainly of rare earth element A, Mn and O and having a hexagonal $YMnO_3$ type structure, an $AlO_x$ thin film composed mainly of Al and O, and a NaCl type nitride thin film composed mainly of titanium nitride, niobium nitride, tantalum nitride or zirconium nitride. The surface layer is an epitaxial film containing a wurtzite type oxide and/or nitride. The surface layer can serve as a functional film such as a semiconductor film or an underlying film therefor, and the substrate structure is useful for the manufacture of electronic devices.

6 Claims, 10 Drawing Sheets

SUBSTRATE STRUCTURES FOR ELECTRONIC DEVICES

This invention relates to substrate structures for electronic devices, and more particularly, substrate structures having a wurtzite type thin film on a silicon substrate for use in electronic devices, for example, devices utilizing the piezoelectric effect such as surface acoustic wave (SAW) devices, semiconductor light-emitting devices such as light-emitting diodes (LED) and laser diodes, heat sinks for ICs, and optical devices such as optical modulators, optical switches and opto-electronic integrated circuits (OEIC).

BACKGROUND OF THE INVENTION

Electronic devices have been elaborated which are fabricated by forming functional films of oxides or nitrides on silicon substrates or semiconductor crystal substrates, followed by integration. Attempts have been made, by combining semiconductor substrates with dielectric thin films, to fabricate dielectric isolated LSI devices having a higher degree of integration than relying on the LSI or silicon-on-insulator (SOI) technology. Using thin films of ferroelectrics belonging to dielectrics, non-volatile memories, infrared sensors, optical modulators, optical switches, and OEIC can be constructed. From the combination of semiconductor substrates with superconductor thin films SQUID, Josephson devices, superconducting transistors, electromagnetic wave sensors and superconductor wired LSI can be constructed. From the combination of semiconductor substrates with piezoelectric thin films, SAW devices, convolvers, collimators, memory devices, image scanners, thin film bulk resonators and filters can be constructed.

To ensure optimum device characteristics and reproducibility thereof for semiconductor devices using such functional films, single crystals are preferably used as the semiconductor substrates. With polycrystalline materials, it is difficult to provide good device characteristics on account of the disturbances of physical quantities by grain boundaries. The same applies to functional films. It is desired that the functional films be epitaxial films which are as close to single crystals as possible.

Most piezoelectric materials which are of worth in applications have a crystal structure of the wurtzite type as typified by ZnO and AlN. Since the epitaxial growth of wurtzite type compounds largely depends on the crystallographic orientation of substrate materials, it is difficult to perform direct epitaxial growth on a silicon single crystal substrate which is of the cubic crystal system.

An attempt to perform direct epitaxial growth of a ZnO thin film on a silicon substrate results in the formation of an $SiO_2$ layer on the surface of the silicon substrate. During growth of ZnO crystals, the presence of an $SiO_2$ layer prevents the configurational information of silicon crystals from being conveyed. As a result, the ZnO thin film is grown as a polycrystalline film of c-axis orientation. For this reason, the epitaxial growth of a ZnO thin film on a silicon substrate has never been reported.

Several reports are found with respect to the direct epitaxial growth of an AlN thin film on a silicon substrate. For example, Jpn. J. Apl. Phys., vol. 20, L173 (1981) reports that using MOCVD (chemical vapor deposition using organic metal), AlN is epitaxially grown on a silicon substrate at a temperature of 1,260° C. There are also found research reports using AlN as the buffer layer for GaN base light-emitting devices. For example, Technical Research Report of the Electronic Communications Society, CPM92 1–13, p. 45 (1992) describes the possibility of epitaxial growth above 1,100° C. using MOVPE (organic metal vapor phase growth).

In either case, the growth temperature of AlN thin films is as high as 1,100° C. or above. When an AlN thin film is formed above 1,000° C., aluminum which constitutes AlN tends to form aluminum silicide by reacting with the silicon substrate. Therefore, when the forming temperature is above 1,000° C., a careful attention must be paid so as to suppress the formation of aluminum silicide, adversely affecting the abilities of mass scale manufacture and reproduction.

Also, thin films of Group III–V nitride semiconductors such as gallium nitride (GaN), aluminum nitride (AlN), indium nitride (InN), aluminum gallium nitride (AlGaN) and mixed crystals thereof are now utilized in nitride semiconductor devices such as field effect transistors, light-emitting diodes (LED), and laser diodes. As described in Nikkei Electronics, No. 674, p. 79 (1996), LEDs having a multilayer structure of nitride semiconductor layers and emitting light of a short wavelength such as blue or green light are of interest.

In semiconductor devices using Group III–V nitride semiconductor layers, for example, GaN thin films, sapphire is generally used as the substrate on which GaN thin films are formed. However, since sapphire has a lattice constant and a coefficient of thermal expansion largely differing from those of GaN, there arises the problem that crystals of quality are not obtained owing to the introduction of dislocations from the interface between the substrate and GaN to the GaN side or the deformation of GaN crystals by stresses. Sapphire substrates are difficult to break so as to expose the cleavage plane, and it is then difficult to form the end face in the manufacture of laser diodes. Sapphire substrates have further problems that they are expensive compared with silicon and other semiconductor substrates and poor in surface flatness. A still further problem of sapphire substrates is the lack of electric conductivity.

On the other hand, because of great differences in lattice constant, coefficient of thermal expansion and lattice structure between silicon and GaN, it is difficult to form GaN thin film of quality on silicon single crystal substrates.

As an attempt for improving the crystallinity of thin films of nitride semiconductors such as GaN, JP-A 45960/1997, for example, discloses the formation of a InGaAlN layer on a sapphire or silicon substrate with a ZnO buffer layer disposed therebetween. In this patent, the ZnO buffer layer is directly formed on the silicon substrate as by sputtering. However, according to our follow-up test, it is substantially impossible to form a ZnO buffer layer on a silicon substrate as a single crystal film (or epitaxial film as used in the present disclosure). The film cannot be a film having good crystallinity and surface flatness. It is then impossible to form on such a ZnO buffer layer, a nitride semiconductor layer having good crystallinity.

Further, JP-A 264894/1996 discloses a semiconductor device comprising a silicon or silicon carbide substrate, at least one of a $Ca_xMg_{1-x}F_2$ layer ($0 \leq x \leq 1$) and a $Mg_tCa_{3-t}N_2$ layer ($0 \leq t \leq 3$) formed thereon, and a $Ga_yIn_zAl_{1-y-z}N$ layer ($0 \leq y, z \leq 1$) formed thereon. The alleged advantages are that silicon or silicon carbide substrates having good surface flatness can be used and GaInAlN layers of quality can be formed. However, our follow-up test revealed that the $Ca_xMg_{1-x}F_2$ layer or $Mg_tCa_{3-t}N_2$ layer formed on the silicon substrate was insufficient in crystallinity and surface flatness. It is then impossible to form on such a layer, a nitride semiconductor layer having good crystallinity.

It is also known from J. Cryst. Growth, 128, 391 (1993) and J. Cryst. Growth, 115, 634 (1991) to use an AlN thin film or SiC thin film as the buffer layer when a GaN thin film is formed on a silicon substrate. However, our follow-up test revealed that the AlN thin film or SiC thin film formed directly on the silicon substrate was insufficient in crystallinity and surface flatness. It is then impossible to form on such a thin film, a nitride semiconductor layer having good crystallinity.

SUMMARY OF THE INVENTION

An object of the present invention is to provide a substrate structure for electronic devices having on a silicon substrate an epitaxial film of the wurtzite type crystal structure which can be utilized as a functional film such as a semiconductor film or as a lower layer for such a functional film.

According to the invention, there is provided a substrate structure for electronic devices, comprising a substrate having a surface, at least the substrate surface formed of single crystal silicon, a buffer layer on the substrate surface, and a surface layer on the buffer layer. The buffer layer is constructed by an oxide buffer layer and/or a nitride buffer layer. The oxide buffer layer includes an R—Zr family oxide thin film which is an epitaxial film composed mainly of an oxide of scandium, yttrium or a rare earth element and/or zirconium oxide, an $AMnO_3$ base thin film which is an epitaxial film composed mainly of A, manganese and oxygen wherein A is scandium, yttrium or a rare earth element and having a crystal structure of hexagonal $YMnO_3$ type, an $AlO_x$ base thin film which is an epitaxial film composed mainly of aluminum and oxygen, or a combination of said R—Zr family oxide thin film with the $AMnO_3$ base thin film and/or the $AlO_x$ base thin film. The nitride buffer layer includes a NaCl type nitride thin film which is an epitaxial film composed mainly of at least one of titanium nitride, niobium nitride, tantalum nitride and zirconium nitride. The surface layer includes an oxide epitaxial film having a wurtzite type crystal structure and/or an nitride epitaxial film having a wurtzite type crystal structure.

In one preferred embodiment, the surface layer includes an AlGaInN base thin film composed mainly of nitrogen and at least one of aluminum, gallium, and indium, a ZnO base thin film composed mainly of zinc oxide, or a combination of the AlGaInN base thin film with the ZnO base thin film. More preferably, the AlGaInN base thin film is a semiconductor.

In another preferred embodiment, the substrate has a silicon (100) face at its surface, and a silicon (110) face of the substrate is parallel to a (1–100) face of the surface layer.

The substrate structure may further comprise a metal thin film on said surface layer, within said surface layer, between said buffer layer and said surface layer, or within said buffer layer, said metal thin film being an epitaxial film composed mainly of at least one of platinum, iridium, osmium, rhenium, palladium, rhenium and ruthenium. More preferably, the metal thin film has a (111) or (0001) face oriented parallel to the substrate surface.

It is understood that for the sake of simplicity, the term "rare earth element" is sometimes used in the specification as including Sc and Y.

In an attempt to perform direct epitaxial growth of a thin film of a wurtzite type compound on a silicon substrate, the high reactivity of the silicon substrate surface allows unnecessary compounds to form prior to the epitaxial growth, which prevent epitaxial growth of the wurtzite type compound. When ZnO is used as the wurtzite type compound, for example, an amorphous $SiO_2$ layer forms thinly on the silicon surface prior to the epitaxial growth of ZnO, restraining the epitaxial growth of ZnO. When a nitride such as AlN is used as the wurtzite type compound, for example, an amorphous SiN layer forms thinly on the silicon surface prior to the growth of the nitride, restraining the epitaxial growth of the desired nitride.

Then, according to the invention, a buffer layer is provided on a substrate having a silicon surface before a thin film (or surface layer) of a wurtzite type compound is formed on the buffer layer. As the buffer layer, there are used the $AMnO_3$ base thin film, R—Zr family oxide thin film, $AlO_x$ base thin film or NaCl type nitride thin film, defined above. This buffer layer can be formed on the silicon substrate as a thin film having high crystallinity and surface flatness. Moreover, since the material of the buffer layer has a crystal structure and a lattice constant approximate to those of the wurtzite type compound, the interposition of the buffer layer permits a thin film having a wurtzite type crystal structure such as the ZnO base thin film or AlGaInN base thin film to be formed on the silicon substrate as an epitaxial film.

Therefore, according to the invention, there are obtained substrate structures for electronic devices in which epitaxial films of wurtzite type compounds are disposed on silicon substrates which are readily available as single crystals of quality and large diameter and are quite inexpensive among single crystals. Since such wurtzite type compounds as ZnO, AlN, GaN and InN exhibit piezoelectricity, the substrate structures of the invention are applicable to such electronic devices as SAW devices, convolvers, thin film bulk resonators, filters, and resonators. By further forming a nitride semiconductor layer on the surface layer or by forming the surface layer itself as a nitride semiconductor layer, nitride semiconductor devices applicable to LED and laser diodes can be constructed. Since silicon single crystal substrates are likely to cleave, the substrate structures of the invention are especially suited for application to laser devices such as laser diodes.

Moreover, according to the invention, thin films of wurtzite type compounds having good crystallinity and surface flatness can be formed not only when silicon (111) substrates are used, but also when silicon (100) substrates are used. That is, even silicon (100) substrates can be used. Since silicon cleaves along the (110) face and since the present invention enables that the relationship in face orientation between the silicon (100) substrate and the wurtzite type compound thin film be Si (100)//wurtzite type compound (0001) and Si (110)//wurtzite type compound (1–100), it is possible that the substrate and the wurtzite type compound thin film coincide in cleavage plane, which is advantageous particularly when the inventive structures are applied to laser devices. It is noted that "−1" in (1–100) indicates overscored "1."

Since the silicon single crystal substrates used herein are inexpensive as compared with sapphire substrates and SiC single crystal substrates, the substrate structures for electronic devices are also inexpensive.

When a wurtzite type nitride which is a semiconductor is used as the surface layer, the invention can provide a semiconductor substrate having a nitride semiconductor thin film.

The substrate structures according to the invention can be applied to various electronic devices, for example, LED, laser diodes, non-volatile memories, infrared sensors, optical modulators, optical switches, OEIC, SQUID, Josephson devices, superconducting transistors, electromagnetic wave sensors, superconductor wired LSI, SAW devices, convolvers, collimators, memory devices, image scanners, thin film bulk resonators and filters.

It is also possible in the present invention to form a metal thin film having good crystallinity and surface flatness on or within the buffer layer or on or within the surface layer. The buffer layer or wurtzite type compound thin film formed on this metal thin film becomes an epitaxial film. Since this metal thin film can serve as an electrode layer or reflecting layer, the invention enables incorporation of the electrode layer or reflecting layer in the substrate structure for electronic devices without a loss of performance.

BRIEF DESCRIPTION OF THE DRAWINGS

These and further features of the present invention will be apparent with reference to the following description and drawings, wherein.

DETAILED DESCRIPTION OF THE INVENTION

Figure 1:
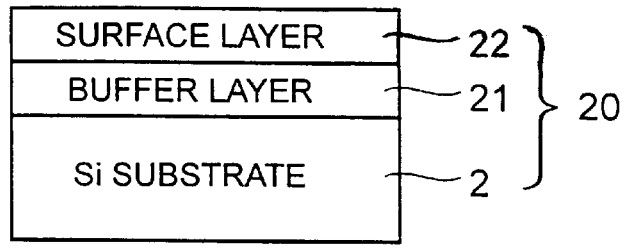
FIGS. 1(a) to 1(e) schematically illustrate substrate structures for electronic devices according to different embodiments of the invention.
Figure 1:
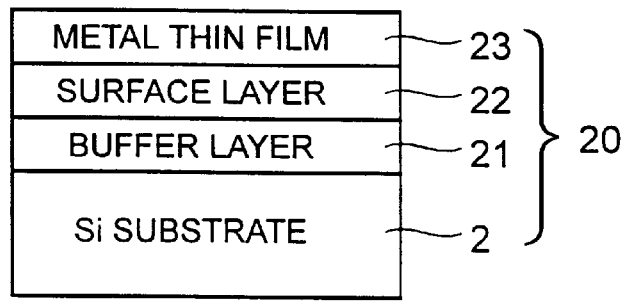
Figure 1:
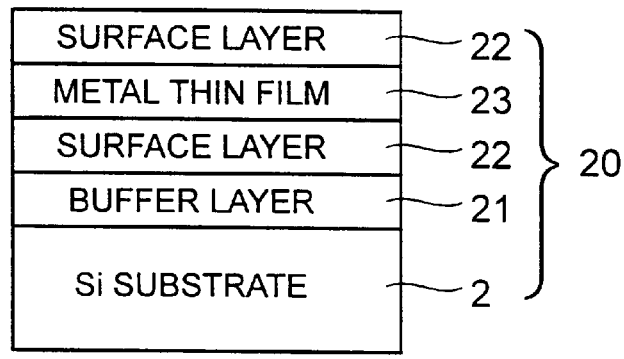
Figure 1:
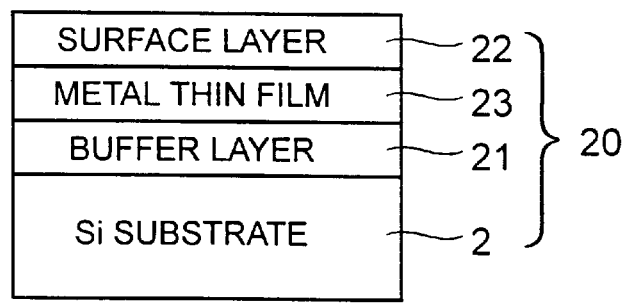
Figure 1:
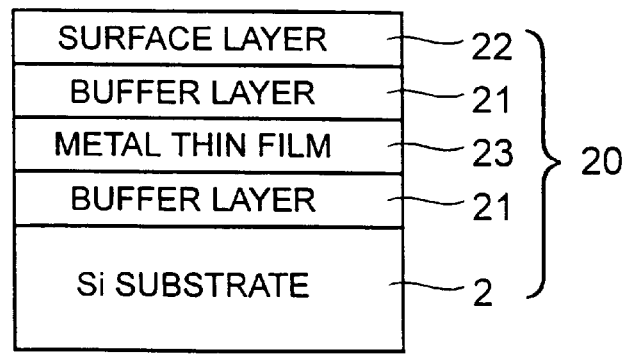

The substrate structure for electronic devices according to the invention is based on a substrate having a surface in which at least the substrate surface is formed of single crystal silicon, and includes a buffer layer on the substrate surface, and a surface layer on the buffer layer. The buffer layer is selected from AMnO$_3$ base thin films, R—Zr family oxide thin films, AlO$_x$ base thin films, and NaCl type nitride thin films. The surface layer is selected from wurtzite type compound thin films such as AlGaInN base thin films and ZnO base thin films. If necessary, a metal thin film is formed on the surface layer, within the surface layer, between the buffer layer and the surface layer, or within the buffer layer. The respective thin films are described later in detail.

Referring to FIGS. 1(a) to 1(e), there are illustrated exemplary constructions of the substrate structure for electronic devices according to the invention. The substrate structure 20 shown in FIG. 1(a) is based on a silicon single crystal substrate 2 and has a buffer layer and a surface layer 22 thereon in the described order. The substrate structure 20 shown in FIG. 1(b) is the same as that of FIG. 1(a) except that it has a metal thin film 23 on the surface layer 22. The substrate structure 20 shown in FIG. 1(c) is the same as that of FIG. 1(a) except that it has a metal thin film 23 within the surface layer 22. The substrate structure 20 shown in FIG. 1(d) is the same as that of FIG. 1(a) except that it has a metal thin film 23 between the buffer layer 21 and the surface layer 22. The substrate structure 20 shown in FIG. 1(e) is the same as that of FIG. 1(a) except that it has a metal thin film 23 within the buffer layer 21.

Where the buffer layer 21 has a multilayer structure consisting of two or more thin films, the order of stacking of thin films is not critical. Where an R—Zr family oxide thin film is included, however, it is preferably disposed on the substrate side. Where the layer has a structure of spaced apart layers, for example, two layers separated by a metal thin film like the surface layer shown in FIG. 1(c) the buffer layer shown in FIG. 1(e), the upper and lower layers may be either of an identical composition or of different compositions.

As described above, the invention requires that when a wurtzite type compound thin film is formed on a silicon single crystal substrate, a specific buffer layer is interposed therebetween. Described below is the reason why the above-described thin films are used as the buffer layer.

Where two layer thin films are continuously formed, the degree of misfit in lattice between the thin film becoming a base (referred to as underlying thin film) and the thin film growing thereon (referred to as growing thin film) is represented by a degree of mismatch. For example, the degree of mismatch δ (unit: %) is represented by the equation:

$$\delta(\%) = (d_{epi} - d_{sub})/d_{sub} \times 100$$

wherein $d_{sub}$ is a lattice constant of the material in bulk form of which the underlying thin film is formed and $d_{epi}$ is a lattice constant of the material in bulk form of which the growing thin film is formed. If the lattice constant of the growing thin film is greater than that of the underlying thin film, values of δ are positive. Inversely, negative values of δ indicate that the lattice constant of the underlying thin film is greater than that of the growing thin film. When δ=0, the lattice of the underlying thin film and the lattice of the growing thin film are coincident with each other, that is, their lattices are fully matched. Regardless of the sign of δ, the greater the magnitude of δ, the greater is the degree of lattice mismatch, that is, more strains or defects caused by the lattice mismatch are introduced into crystals, which is undesirable.

When a wurtzite type compound thin film such as an AlN thin film is directly formed on a silicon single crystal substrate, provided that the relationship between both the crystals during epitaxial growth is Si [111]//AlN [0001], the degree of mismatch δ is calculated to be as large as −19.0% based on the lattice constant within the Si (111) plane which is 0.384 nm and the lattice constant within the AlN (0001) plane (a-axis lattice constant) which is 0.311 nm.

Figure 2:
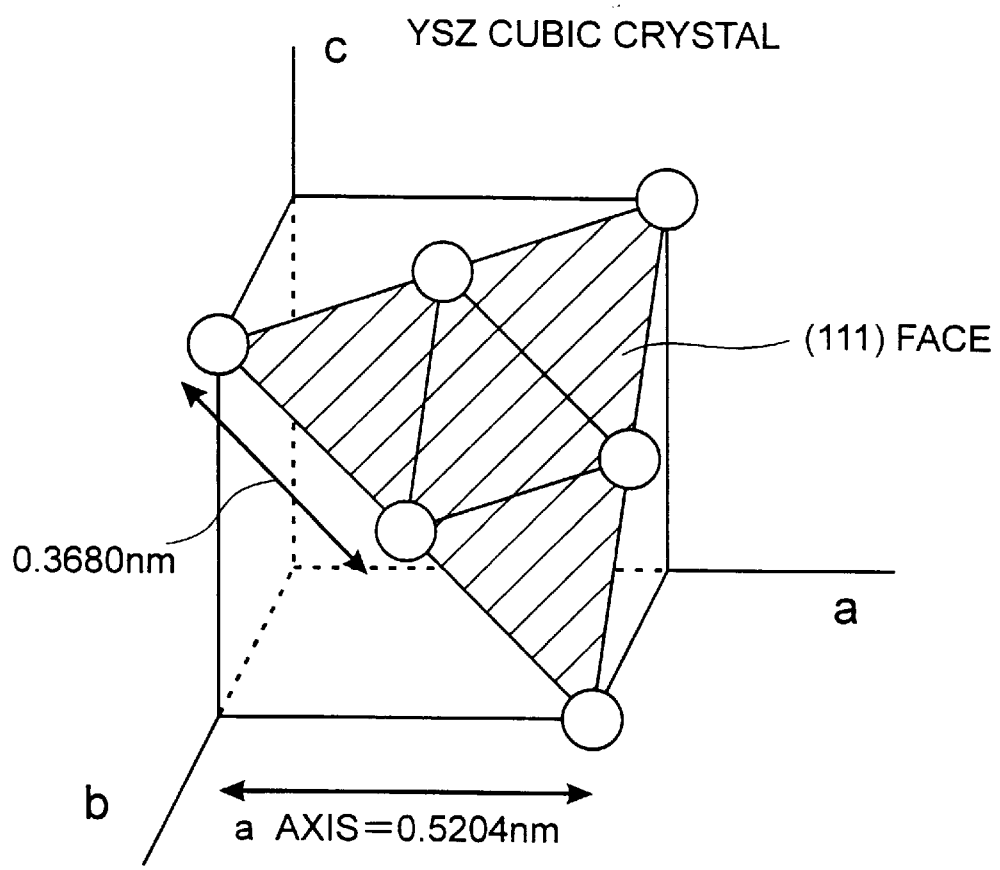
FIG. 2 is a schematic view illustrating lattice constants of a YSZ cubic crystal.

In contrast, in an example wherein an R—Zr family oxide thin film such as a YSZ thin film is used as the buffer layer according to the invention (YSZ is yttrium-stabilized zirconia), since the YSZ crystal is usually cubic and the lattice constant of its a axis is 0.520 nm, the lattice constant within the YSZ (111) plane is 0.368 nm as shown in FIG. 2. Then the lattice within the YSZ (111) plane matches with the lattice within the AlN (0001) plane, and the degree of mismatch δ is −15.5%. Accordingly, by providing a buffer layer consisting of a YSZ thin film on a silicon substrate, the degree of mismatch is improved over the direct formation of an AlN thin film on a silicon substrate, permitting an AlN thin film to be formed as an epitaxial film.

In an example wherein the above-mentioned YSZ is used as the buffer layer and a GaN thin film is used as the wurtzite type compound thin film, the lattice within the YSZ (111) plane matches with the lattice within the GaN (0001) plane (lattice constant 0.319 nm), and the degree of mismatch δ is as low as −13.3%.

Also, in examples wherein $Yb_2O_3$, $Lu_2O_3$ and $Sc_2O_3$ are used instead of YSZ, their lattice constants in the (111) plane are 0.3679 nm, 0.3674 nm, and 0.3481 nm, and the matching with the GaN (0001) plane becomes better.

Also, in examples wherein TiN and ZrN are used instead of YSZ, their lattice constants in the (111) plane are 0.300 nm and 0.326 nm, and the degrees of mismatch with the GaN (0001) plane become as low as +6.33% and −2.15%, respectively.

In further examples wherein the above-mentioned GaN thin film is used as the wurtzite type compound thin film and an $AMnO_3$ base thin film, for example, a $HoMnO_3$ thin film is used as the buffer layer, the lattice constant within the $HoMnO_3$ (0001) plane is 0.614 nm, and one half of this lattice matches with the lattice within the GaN (0001) plane, and the degree of mismatch δ is very low and +3.91%.

In the nitride semiconductor device utilizing the substrate structure for electronic devices according to the invention, a nitride semiconductor layer and an underlying nitride layer are formed on the surface layer. Since these nitride layers are generally constructed by wurtzite type crystals having the composition represented by $Ga_xIn_yAl_{1-x-y}N$ (wherein $0 \leq x \leq 1$, $0 \leq x+y \leq 1$), the lattice matching with the surface layer is very good. More illustratively, the materials of which the ZnO base thin film used as the surface layer and the AlGaInN base thin film are formed, for example, ZnO crystals and AlN crystals have lattice constants in the (0001) plane of 0.325 nm and 0.311 nm, respectively. Where GaN is used as the nitride semiconductor layer or underlying layer, the lattice within the (0001) plane of the surface layer matches with the lattice within the (0001) plane of GaN. Then the degree of mismatch δ is very low and −1.85% for ZnO and +2.57% for AlN.

Of the materials of which the metal thin film is constructed, for example, Pt crystals have a lattice constant within (111) plane of 0.554 nm. One half of this lattice matches with the lattice of GaN within (0001) plane, and the degree of mismatch δ is low and +15.1%. Then, the provision of a metal thin film above or below the surface layer causes little disturbance to the surface crystallinity of the substrate structure for electronic devices.

Where the buffer layer is a laminate of two or more thin films of different compositions and where the buffer layer is a graded structure film whose composition gradually changes in the thickness direction, the misfit between the crystal lattice at the outermost surface of the buffer layer and the crystal lattice of the surface layer of wurtzite type compound can be further reduced, which in turn enables to form a surface layer of higher crystallinity. For example, while the arrangement wherein a surface layer of (0001) oriented AlN is formed on a buffer layer of (111) oriented YSZ gives a δ value of −15.5% as previously described, δ can be further reduced by forming the buffer layer as a laminate structure of a YSZ thin film and a ZrN thin film (NaCl type nitride thin film) so that the ZrN thin film is in close contact with the AlN thin film. Since ZrN has an a-axis lattice constant of 0.461 nm, the lattice constant of the ZrN film within (111) plane is $(2^{1/2} \times 0.461)/2 = 0.326$ nm. This lattice matches with the lattice of AlN within (0001) plane and δ is −4.6%. The degree of mismatch is significantly improved.

The advantages of the buffer layer of a multilayer structure are not only the improvement in degree of mismatch, but also the reduction of stress in the entire thin film multilayer structure and the improvement in characteristics (e.g., temperature characteristics) of the substrate structure for electronic devices.

As described above, according to the invention, by forming a wurtzite type compound thin film on a specific buffer layer on a silicon substrate, the degree of lattice mismatch is reduced as compared with the direct formation of a wurtzite type compound thin film on a silicon substrate. Thus the invention is successful in forming a surface layer of a wurtzite type compound having high crystallinity.

Next, the substrate and the respective thin films constructing the substrate structure for electronic devices according to the invention are described in detail.

Substrate

The substrate used herein is one having single crystal silicon at its surface. The substrate surface is preferably constructed by the (111) or (100) face of silicon single crystals. More preferably, the substrate surface is constructed by the (111) face. Although cracks can occur in thin films formed on the substrate under certain conditions, the occurrence of cracks can be suppressed by reducing the thickness of the substrate, preferably by adjusting the thickness to about 10 to 100 μm, more preferably about 25 to 75 μm.

Buffer Layer

In order that the surface layer with high crystallinity be formed thereon, the buffer layer should preferably have satisfactory crystallinity and surface flatness. More illustratively, the thin film serving as the buffer layer should preferably have such crystallinity that the half value width of a rocking curve of reflection on (111) face upon x-ray diffraction may be 1.5° or smaller. Also, when the surface flatness of the thin film serving as the buffer layer is represented by surface roughness Rz (ten point mean roughness, reference length 500 nm) as measured by an AFM (atomic force microscope), Rz is preferably up to 2 nm, more preferably up to 0.60 nm. It is desired that such a surface roughness be available over a region accounting for at least 80%, more preferably at least 90%, especially at least 95% of the surface of the thin film. The above-described surface roughness is a value obtained by carrying out measurement at arbitrary 10 or more points evenly distributed over an area of at least 10 cm$^2$ of a thin film formed over the entire surface of a substrate. The requirement of the invention that at least 80% of the surface of the thin film have a Rz of up to 2 nm means that when measurement is made at more than 10 points as described above, Rz is up to 2 nm at 80% or more of the measured points. It is noted that the surface roughness Rz is prescribed in JIS B-0610.

With respect to the half-value width of a rocking curve and Rz of a thin film serving as the buffer layer, no particular lower limit values need be determined while smaller values are preferred. At the present, the lower limit of the half-value width of a rocking curve is about 0.7°, especially about 0.4° and the lower limit of Rz is about 0.10 nm.

Also, if a RHEED image of a thin film serving as the buffer layer is streaky and sharp, it indicates that the thin film has improved crystallinity and surface flatness. The same applies to other thin films serving as the surface layer and the metal thin film.

Now the respective thin films constructing the buffer layer are described in detail.

AMnO$_3$ Base Thin Film

The AMnO$_3$ base thin film has a crystal structure of the hexagonal YMnO$_3$ type and is composed mainly of A, manganese (Mn) and oxygen (O) wherein A is scandium (Sc), yttrium (Y) or a rare earth element. This thin film has a c-face oriented parallel to the substrate surface.

In the AMnO$_3$ base material of which the AMnO$_3$ base thin film is constructed, the atomic ratio A/Mn preferably ranges from 0.8 to 1.2, more preferably from 0.9 to 1.1. With A/Mn falling in this range, the AMnO$_3$ base thin film is improved in crystallinity and surface flatness. Since the AMnO$_3$ base thin film serves as the buffer layer which assists in depositing thereon a nitride thin film of quality, it is required to be improved in crystallinity and surface flatness. It is noted that since oxygen defects or excessive oxygen are usually present in the AMnO$_3$ base material, the atomic ratio of O to Mn is usually from about 2.7 to about 3.3.

While the AMnO$_3$ base materials include those having a hexagonal crystal structure and those having a rhombic crystal structure, AMnO$_3$ base materials of the hexagonal system are used in the practice of the invention. Since it is necessary in the invention to form thereon a GaInAlN nitride thin film of hexagonal system, the AMnO$_3$ base thin film should also be formed of a crystalline material of hexagonal system in order to achieve lattice matching.

A in the AMnO$_3$ base material is preferably at least one of Y, Ho, Er, Yb, Tm and Lu. A solid solution containing two or more AMnO$_3$ wherein A is different elements may be used as the AMnO$_3$ base material.

The AMnO$_3$ base thin film is a thin film whose c face is oriented parallel to the substrate, that is, a (0001) oriented film, preferably a c-face unidirectionally oriented film, more preferably an epitaxial film. The unidirectionally oriented film is preferred because it has good crystallinity and surface flatness. The epitaxial film is more preferred because it has better crystallinity and surface flatness.

The "unidirectionally oriented film" used herein designates a film in which as measured by x-ray diffractometry, the peak intensity of reflection on faces other than the objective crystal face is up to 10%, preferably up to 5% of the maximum peak intensity of reflection on the objective crystal face. Illustratively stated, a (0001) unidirectionally oriented or c-face unidirectionally oriented film, for example, is a film having an intensity of reflection other than on (000L) face which is up to 10%, preferably up to 5% of the maximum peak intensity of reflection on (000L) face as analyzed by 2θ–θ x-ray diffraction (XRD). It is noted that the (000L) face generally designates those equivalent faces such as (0001) and (0002) faces. Also, a (111) unidirectionally oriented film, for example, is a film having an intensity of reflection other than on (LLL) face which is up to 10%, preferably up to 5% of the maximum peak intensity of reflection on (LLL) face. It is noted that the (LLL) face generally designates those equivalent faces such as (111) and (222) faces.

The term "epitaxial film" used herein is a unidirectionally oriented film in which crystals can be oriented in alignment in all the directions of X, Y, and Z axes, provided that the film surface is a X-Y plane and the film's thickness direction is Z axis. This orientation is confirmed by a spotty or streaky pattern as analyzed by RHEED. If these requirements are met, then this film is regarded to be an epitaxial film. It is understood that RHEED is an abbreviation of reflection high energy electron diffraction and the RHEED analysis is an index of the orientation of a crystal axis within a film plane.

Preferably the AMnO$_3$ base thin film has a thickness of 1 to 1,000 nm, more preferably 3 to 50 nm. A too reduced thickness is undesirable because it would become difficult to form a homogeneous continuous film. A too thick film would become poor in surface flatness.

R—Zr Family Oxide Thin Film

The R—Zr family oxide thin film may be used as the buffer layer alone or in combination with another oxide buffer layer (e.g., an AMnO$_3$ thin film or AlO$_x$ thin film) or a nitride buffer layer (e.g., a NaCl type nitride thin film). When the buffer layer is of multilayer structure, the R—Zr family oxide thin film should preferably provided as an underlying layer relative to other thin films within the same buffer layer. The provision of the R—Zr family oxide thin film as an underlying layer prevents the other thin films from being separated. Further, since the R—Zr family oxide thin film has good lattice matching with the other thin films mentioned above, the R—Zr family oxide thin film helps epitaxial growth of the other thin film and contributes to an improvement in its crystallinity, especially when the other thin film is formed relatively thick. It is noted that when the other thin film is relatively thin, its crystallinity is good even in the absence of the R—Zr family oxide thin film.

The R—Zr family oxide thin film is an epitaxial film composed mainly of an oxide of scandium (Sc), yttrium (Y) or a rare earth element and/or zirconium oxide.

Preferred examples of the rare earth oxides are Yb$_2$O$_3$, Tm$_2$O$_3$, Er$_2$O$_3$, Y$_2$O$_3$, Ho$_2$O$_3$, Gd$_2$O$_3$, Dy$_2$O$_3$, Tb$_2$O$_3$, Pr$_2$O$_3$, Nd$_2$O$_3$, CeO$_2$, Eu$_2$O$_3$, Sm$_2$O$_3$, La$_2$O$_3$, Sc$_2$O$_3$, and Lu$_2$O$_3$. With the matching of the lattice constant taken into account, Yb$_2$O$_3$, Sc$_2$O$_3$ and Lu$_2$O$_3$ are more preferred. A solid solution of two or more oxides selected from the above examples may also be used as the rare earth oxide. Where two or more rare earth elements are contained, their ratio is arbitrary. These oxides may deviate from their stoichiometry.

Preferably zirconium oxide is substantially of the composition: ZrO$_2$ although it may deviate from the stoichiometry.

Where the R—Zr family oxide thin film is a solid solution of a rare earth oxide and zirconium oxide, the ratio of components is arbitrary. For surface flatness, it is preferred that the R—Zr family oxide thin film consist essentially of a rare earth oxide or zirconium oxide. Where the R—Zr family oxide thin film is composed mainly of zirconium oxide, the insulation resistance becomes higher and the leakage current becomes reduced as the purity of zirconium oxide is higher. If insulation resistance is necessary, the use of zirconium oxide of higher purity is preferred. Also where the R—Zr family oxide thin film is composed mainly of zirconium oxide, the proportion of Zr in the constituents (other than oxygen) of the thin film is preferably more than 93 mol %, more preferably at least 95 mol %, further preferably at least 98 mol % and most preferably at least 99.5 mol %. In a zirconium oxide thin film of high purity, the constituents other than Zr and oxygen are usually rare earth elements and phosphorus (P). The upper limit of the Zr proportion is about 99.99 mol % at the present. Since separation of $ZrO_2$ from $HfO_2$ is difficult with the currently available ultra-purifying technique, the purity of $ZrO_2$ generally indicates the purity of Zr+Hf. Therefore, the purity of $ZrO_2$ in the specification is a value calculated on the assumption that Hf and Zr are identical. However, this gives rise to no problem because $HfO_2$ serves exactly the same function as $ZrO_2$ in the zirconium oxide base thin film according to the invention.

Additives may be admixed in the R—Zr family oxide thin film for the purpose of improving its characteristics. For example, if the thin film is doped with an alkaline earth element such as Ca and Mg, then the number of pinholes in the film can be reduced to restrain leakage. Also, aluminum and silicon are effective for lowering the resistivity of the film. Further, transition metal elements such as Mn, Fe, Co, and Ni allow the film to form therein an energy level (or trap level) due to the impurity, which can be utilized to control conductivity.

The R—Zr family oxide thin film must have good matching of lattice constant with the $AMnO_3$ base thin film or the surface layer. Since the $AMnO_3$ material and the material of the surface layer are both hexagonal crystals, the R—Zr family oxide thin film is preferably an epitaxial film of (111) orientation. It is noted that since the metal thin film to be described later becomes (111) oriented even when the underlying thin film is (001) oriented, the R—Zr family oxide thin film can be a thin film of (001) orientation when a metal thin film is to be formed on the R—Zr family oxide thin film.

Of the R—Zr family oxide thin films, the rare earth oxide thin film becomes (111) oriented whether it is formed on a silicon (111) substrate or a silicon (100) substrate. Where the rare earth oxide thin film is formed on a silicon (100) substrate, the thin film is preferably composed of $Pr_2O_3$. A thin film of $Pr_2O_3$ can be formed as a thin film having high crystallinity. Of the R—Zr family oxide thin films, the zirconium oxide thin film becomes (111) oriented on a silicon (111) substrate, but (001) oriented on a silicon (100) substrate.

An appropriate thickness of the R—Zr family oxide thin film varies with a particular application although it is preferably 5 to 500 nm, more preferably 10 to 50 nm. The R—Zr family oxide thin film is desirably thin as long as its crystallinity, surface flatness and insulation are not adversely affected. Where the R—Zr family oxide thin film is used as an insulating layer, an appropriate thickness is about 10 to 500 nm.

Understandably, the R—Zr family oxide thin film may be a laminate of two or more thin films of different compositions. The R—Zr family oxide thin film may also be a graded structure film whose composition gradually changes in the thickness direction.

$AlO_x$ Base Thin Film

The $AlO_x$ base thin film is an epitaxial film composed mainly of aluminum (Al) and oxygen (O). Based on x-ray diffraction analysis, it is believed that the $AlO_x$ base thin film becomes effective as the buffer layer when it assumes a $\gamma$-$Al_2O_3$ type structure. The value of x is usually from 1.0 to 1.7.

The $AlO_x$ base thin film may be formed directly on a silicon (111) substrate or on an oxide buffer layer of (111) orientation. In either case, the $AlO_x$ base thin film becomes an epitaxial film of (111) orientation.

An appropriate thickness of the $AlO_x$ base thin film is 5 to 500 nm, more preferably 5 to 20 nm. The $AlO_x$ base thin film is desirably thin as long as its crystallinity and surface flatness are not adversely affected.

Understandably, the $AlO_x$ base thin film may be a laminate of two or more thin films of different compositions. The $AlO_x$ base thin film may also be a graded structure film whose composition gradually changes in the thickness direction.

NaCl Type Nitride Thin Film

The NaCl type nitride thin film is an epitaxial film composed mainly of one of titanium nitride, niobium nitride, tantalum nitride and zirconium nitride or a solid solution containing two or more of these nitrides.

Where the NaCl type nitride thin film is composed of a solid solution containing two or more nitrides, the ratio of nitrides is arbitrary. The nitride(s) contained in the NaCl type nitride thin film may deviate from its stoichiometry.

The NaCl type nitride thin film is effective for achieving the matching of lattice constant between the NaCl type nitride thin film and a surface layer of wurtzite type compound to be formed thereon, thereby playing the role of helping to form the surface layer of high crystallinity. Since the surface layer formed close to the NaCl type nitride thin film is hexagonal, the NaCl type nitride thin film is desired to be an epitaxial film whose (111) face is oriented parallel to the substrate surface.

It is noted that the NaCl type nitride thin film may be formed directly on a silicon (111) substrate or on an oxide buffer layer of (111) orientation. In either case, the NaCl type nitride thin film becomes an epitaxial film of (111) orientation.

An appropriate thickness of the NaCl type nitride thin film is 5 to 500 nm, more preferably 10 to 50 nm. The NaCl type nitride thin film is desirably thin as long as its crystallinity and surface flatness are not adversely affected.

Understandably, the NaCl type nitride thin film may be a laminate of two or more thin films of different compositions. The NaCl type nitride thin film may also be a graded structure film whose composition gradually changes in the thickness direction.

Surface Layer

The surface layer is an epitaxial film composed of a compound having a wurtzite type crystal structure, preferably whose (0001) face is oriented parallel to the substrate surface.

By utilizing the substrate having a Si (100) face at its surface and the buffer layer such as the R—Zr family oxide thin film of (111) orientation described above or the metal thin film of (111) orientation to be described later, the present invention enables that the relationship of crystal lattice between the substrate and the surface layer be Si (100)//wurtzite type compound (0001) and Si (110)// wurtzite type compound (1–100). Therefor, the invention is especially suited in the application to those devices which are fabricated utilizing the cleavage of crystals.

To prepare an electronic device-forming substrate structure having excellent characteristics, it is preferred that the surface layer be improved in crystallinity and surface flatness. Illustratively, the surface layer has such crystallinity that a rocking curve of reflection on a (0001) face upon X-ray diffraction has a half-value width of up to 2.50°. Also preferably, the surface roughness (ten point mean roughness) Rz of the surface layer is up to 20 nm, especially up to 10 nm, as measured by AFM across a reference length of 500 nm. It is desired that such a surface roughness be available over a region of at least 80%, more preferably at least 90%, especially at least 95% of the surface. The above-described surface roughness is a value obtained by carrying out measurement at arbitrary 10 or more points evenly distributed over an area of at least 10 cm$^2$ of a thin film formed over the entire surface of the substrate.

With respect to the half-value width of a rocking curve and Rz of the surface layer, no particular lower limit values need be determined while smaller values are preferred. At the present, the lower limit of the half-value width of a rocking curve is about 1.7°, especially about 1.0° and the lower limit of Rz is about 0.10 nm.

The surface layer may be polished on its surface for improving its flatness. For polishing, there may be used chemical polishing using base solution, mechanical polishing using colloidal silica, etc., and a combination of chemical polishing and mechanical polishing. Such polishing may also be carried out on the other layers (other than the surface layer).

The surface layer preferably has a thickness of 5 nm to 50 $\mu$m, more preferably 0.5 to 10 $\mu$m. If the surface layer is too thin, electronic device-forming substrate structures having excellent characteristics cannot be formed in some applications. If the surface layer is too thick, the productivity would become low. It is noted that when the electronic device-forming substrate structure according to the invention is applied to a substrate for SAW devices, the surface layer should preferably have a thickness of about 3 $\mu$m or more so that surface acoustic waves propagating through the surface layer may not encounter the influence of the silicon substrate having a slow propagation speed.

Understandably, the surface layer may be a laminate of two or more thin films of different compositions. The surface layer may also be a graded structure film whose composition gradually changes in the thickness direction.

The composition of the surface layer is not critical and can be determined as appropriate so that the characteristics necessary for the desired electronic device-forming substrate structure may be obtained. For example, since the lattice constant and the coefficient of thermal expansion can be adjusted in terms of composition, the composition of the surface layer is selected in accordance with the lattice constant and the coefficient of thermal expansion of a thin film to be formed on the electronic device-forming substrate structure. Preferably, the surface layer is composed of an AlGaInN base thin film or ZnO base thin film, which are described below.

AlGaInN Base Thin Film

The AlGaInN base thin film is an epitaxial film having a wurtzite type crystal structure and composed mainly of nitrogen and at least one of aluminum (Al), gallium (Ga) and indium (In).

The composition of the AlGaInN base thin film is not critical although it is preferred that the AlGaInN base thin film is substantially of the composition: $Ga_xIn_yAl_{1-x-y}N$ wherein $0 \leq x \leq 1$ and $0 \leq x+y \leq 1$.

The AlGaInN base thin film may also be an n type or p type semiconductor film. When converted into a semiconductor film, the film can be used as part of the nitride semiconductor device to be described later. For the semiconductor conversion, dopants well known for the conversion of $Ga_xIn_yAl_{1-x-y}N$ into a semiconductor, for example, silicon (Si) and magnesium (Mg) may be added. A multilayer configuration having a P-N junction or double heterojunctions is also acceptable.

ZnO Base Thin Film

The ZnO base thin film is composed mainly of zinc oxide, preferably consists essentially of ZnO.

Metal Thin Film

The metal thin film is provided for the following reason. The metal thin film mainly functions as an electrode in the electronic device-forming substrate structure according to the invention. In electronic parts utilizing a wurtzite type compound thin film such as ZnO or AlN as a functional film, for example, optical modulators and thin film bulk resonators, an electric field is applied in the thickness direction of the functional film in order that the parts exert their function. Such applications require the electrode disposed below the functional film. For light-emitting devices such as LED and laser diodes, it is important to increase the intensity of light. A high intensity is achievable by forming semiconductor thin films of higher quality. For some other devices, a high intensity is readily achievable by providing the device with a function of reflecting light emission. For example, a thin film serving as a reflecting layer is disposed at an appropriate position within the device, thereby promoting the release of light outside the device. The metal thin film used in the invention can function as the reflecting layer. Also, since the metal thin film plays the role of absorbing stresses in the thin film laminate, the metal thin film is effective for preventing cracks from occurring in an overlying thin film.

Furthermore, the metal thin film is effective for achieving the matching of lattice constant with an overlying thin film, thereby playing the role of helping to form the overlying thin film of high crystallinity. To this end, the metal thin film is desired to be improved in crystallinity and surface flatness as is the above-described R—Zr family oxide thin film.

The metal thin film is an epitaxial film which is basically composed of cubic or hexagonal crystals and has a (111) face or (0001) face oriented parallel to the film surface. The crystals can be deformed by stresses into tetragonal crystals or crystals deviated from cubic or hexagonal ones. In order to form a metal thin film of (111) orientation, the underlying R—Zr family oxide thin film may be either of (111) orientation or of (001) orientation. In either case, the metal thin film becomes (111) oriented. In order to form a metal thin film of (0001) orientation, the underlying R—Zr family oxide thin film is preferably of (111) orientation. However, even when the underlying R—Zr family oxide thin film is of (001) orientation, it is possible to form a metal thin film of (0001) orientation.

The location of the metal thin film is not critical and may be on the surface layer, within the surface layer, between the buffer layer and the surface layer, or within the buffer layer as shown in FIGS. 1(*b*), 1(*c*) and 1(*d*). A choice may be made in accordance with a particular electronic device to which the invention is applied.

The metal thin film is preferably composed mainly of at least one of platinum (Pt), iridium (Ir), osmium (Os), rhenium (Re), palladium (Pd), rhodium (Rh) and ruthenium (Ru). The metal thin film is preferably composed of such a single metal element or an alloy thereof. It is understood that Pt, Ir, Pd and Rh become cubic while Os, Re and Ru become hexagonal.

The thickness of the metal thin film varies with a particular application although it is preferably 5 to 500 nm, more preferably 50 to 150 nm. The metal thin film is desirably thin as long as its crystallinity and surface flatness are not adversely affected. More illustratively, in order to function as the reflecting mirror, the metal thin film is preferably at least 30 nm thick, with sufficient reflectivity being available at a thickness of up to 100 nm. In order to function as the electrode, the metal thin film is preferably 50 to 500 nm thick.

Nitride Semiconductor Device

When the electronic device-forming substrate structure of the invention is applied to a nitride semiconductor device, it is preferred that the surface layer of nitride has been a semiconductor as previously mentioned. If necessary, a nitride semiconductor layer may be formed on the surface layer. Adding electrodes and optional components to this configuration yields a nitride semiconductor device.

The reason why a nitride semiconductor layer is further formed on the surface layer of nitride is as follows. If the substrate temperature is relatively high during formation of the surface layer of nitride, it becomes relatively difficult to uniformly form growth nuclei and hence, to achieve surface flatness. Inversely, if the substrate temperature is relatively low, growth nuclei are uniformly formed, but it becomes relatively difficult to achieve good crystallinity. Therefore, if it is difficult to find a compromise between surface flatness and crystallinity in the surface layer consisting of a single nitride thin film, it is recommended to form the surface layer of nitride at a relatively low temperature and form thereon a nitride semiconductor layer at a relatively high temperature. In this case, the surface layer and the nitride semiconductor layer may be either of an identical composition or of different compositions.

The nitride semiconductor layer may be formed in the same manner as the semiconductive AlGaInN base thin film.

The thickness of the nitride semiconductor layer is usually about 2 nm to about 5 μm although it varies with the function.

The nitride semiconductor device utilizing the electronic device-forming substrate structure according to the invention can be used in various applications which take advantage of the high crystallinity and surface flatness of the nitride semiconductor layer. For example, by forming a Schottky electrode on one nitride semiconductor layer, Schottky diodes can be constructed. By providing plural nitride semiconductor layers to form a pn junction, diodes, transistors and solar cells can be constructed. By providing an active layer, light-emitting diodes can be constructed. By providing a resonant structure, laser diodes can be constructed.

Figure 3:
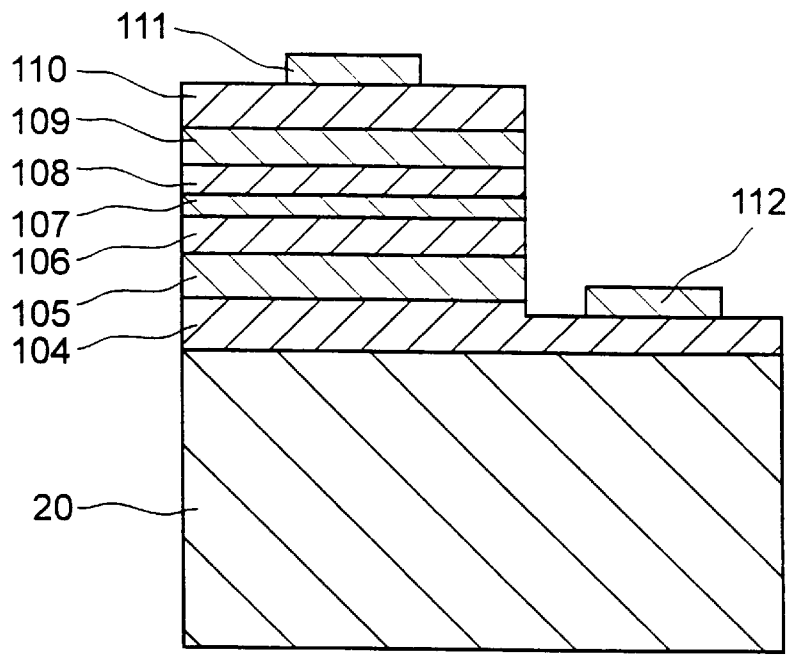
FIG. 3 is a schematic cross-sectional view of a LED which is one exemplary nitride semiconductor device.

FIG. 3 illustrates one exemplary construction of the electronic device-forming substrate structure according to the invention which is applied to a light-emitting diode.

In the light-emitting diode shown in FIG. 3, a film stack including a nitride semiconductor layer is formed on the surface layer, typically (0001) oriented GaN thin film, of the electronic device-forming substrate structure 20 according to the invention. The film stack includes, from the electronic device-forming substrate structure 20 side, an n-type contact layer 104 in the form of an n-type GaN (0001) grown film richly doped with Si, a second n-type clad layer 105 in the form of an n-type $Al_{0.3}Ga_{0.7}N$ film doped with Si, a first n-type clad layer 106 in the form of an n-type $In_{0.01}Ga_{0.99}N$ film doped with Si, an active layer 107 in the form of an undoped $In_{0.05}Ga_{0.95}N$ film, a first p-type clad layer 108 in the form of a p-type $In_{0.01}Ga_{0.99}N$ film doped with Mg, a second p-type clad layer 109 in the form of a p-type $Al_{0.3}Ga_{0.7}N$ film doped with Mg, and a p-type contact layer 110 in the form of a p-type GaN film doped with Mg.

In forming such light-emitting diodes, it is preferred to anneal the layers at the end of formation in order to improve the semiconductor characteristics of the p-type layers in the film stack. After annealing, the layers are etched at the predetermined position to expose the n-type contact layer. A positive electrode 111 of Au is formed on the p-type contact layer, and a negative electrode 112 of Al is formed on the n-type contact layer, as by evaporation. Thereafter, the substrate is divided into device units, yielding light-emitting diodes.

Manufacturing Method

In manufacturing the electronic device-forming substrate structure of the invention, the methods of forming the respective thin films are not critical. For the formation of the buffer layer and the metal thin film, evaporation is preferably employed in accordance with the method described in JP-A 109099/1996 by TDK Corporation. For the formation of the surface layer, sputtering, MOVPE (organic metal vapor phase epitoxy) or MBE (molecular beam epitaxy) method is preferably employed, with the sputtering method being especially preferred. Although the substrate temperature must be heated as high as about 1,000° C. in the MOVPE method, we empirically found that by the sputtering method, a surface layer of high crystallinity can be formed at a substrate temperature of about 600° C. Even at lower substrate temperatures, but above 200° C., a surface layer of high crystallinity can be formed. Unlike the MOVPE method, the sputtering method is easy to reduce the internal stress in the thin film because the internal stress can be controlled as desired in terms of various conditions, for example, a gas pressure, substrate-to-target distance, and input power.

The substrate on which a thin film laminate including the buffer layer, surface layer and optional metal thin film is provided is typically a silicon single crystal wafer. Since the silicon single crystal wafer is easy to form to a large surface area, for example, of more than 10 $cm^2$ and very inexpensive among single crystal substrates, electronic device-forming substrate structures of the invention can be manufactured at a considerably low cost. Then the present invention can accommodate for the current semiconductor process which commonly uses silicon wafers with a diameter of 2 to 8 inches, especially 6 inches. Also the thin film laminate can be formed on a selected portion of the wafer surface through a mask.

In the electronic device-forming substrate structures of the invention, the substrate surface, that is, the surface of the substrate on which the buffer layer is to be formed can be oxidized to a slight depth (of less than about 5 nm, for example) so that an oxide layer of $SiO_2$ or the like is formed. Such oxide layer is formed as a result of oxygen in the oxides in the thin film laminate diffusing into the substrate surface. Also during the formation of the thin film laminate, the substrate surface can be oxidized when a certain method is employed. The oxidized layer formed thereby will remain and become the oxide layer mentioned above.

EXAMPLE

Examples of the invention are given below by way of illustration and not by way of limitation.

Example 1

An electronic device-forming substrate structure 20 as shown in FIG. 1(a) including (1) a Si (111) substrate,
(2) an $AMnO_3$ base thin film ($HoMnO_3$ thin film) and
(3) a surface layer (GaN thin film), the latter two films being stacked on the substrate in the described order, was fabricated by the following procedure.

As the Si (111) substrate, a silicon single crystal wafer with a diameter of 2 inches and a thickness of 300 μm which was cut so as to make (111) face a surface and mirror polished was used. The wafer surface was cleaned by etching with a 40% aqueous solution of ammonium fluoride.

Figure 4:
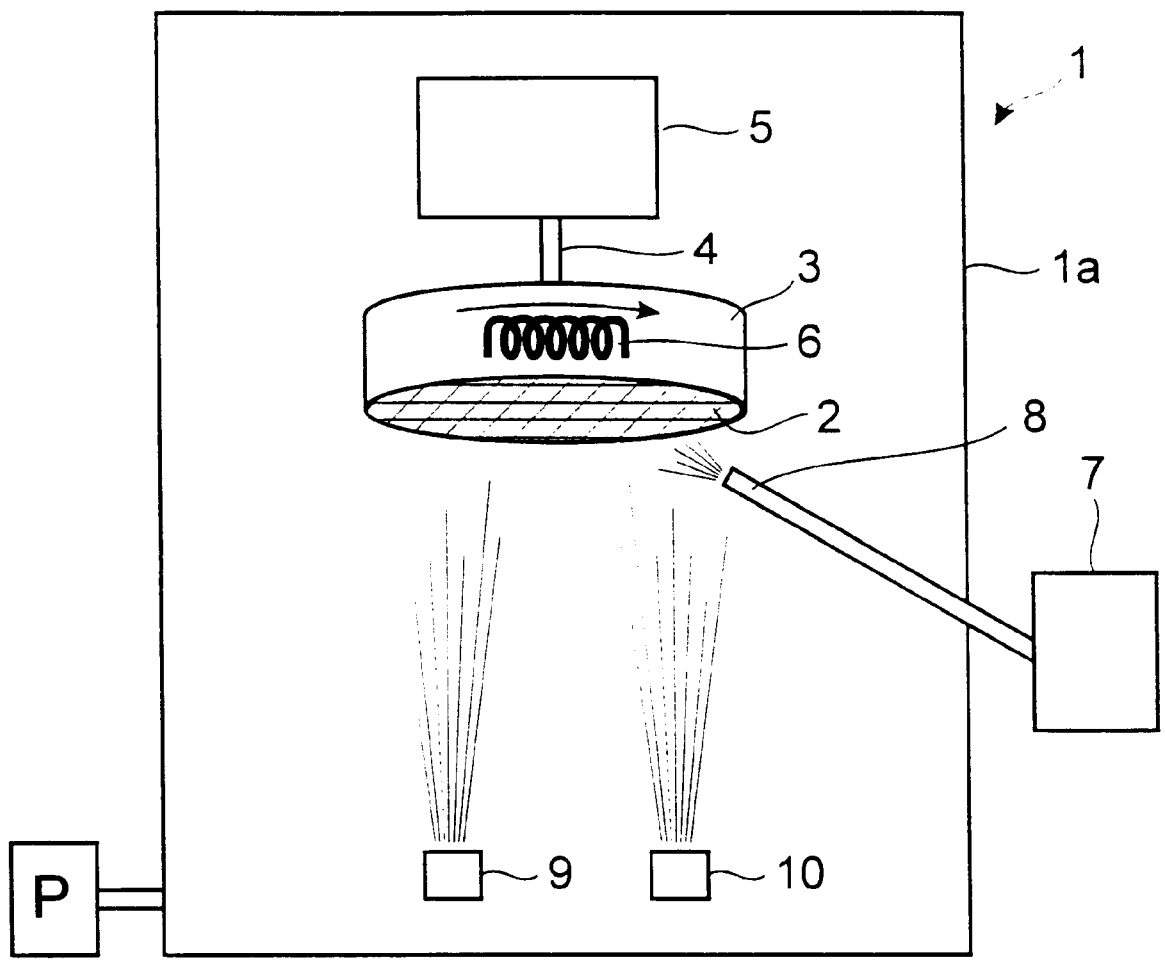
FIG. 4 schematically illustrates an evaporation chamber for use in the manufacture of substrate structures according to the invention.

An evaporation apparatus as shown in FIG. 4 was used. The evaporation apparatus 1 includes a vacuum chamber 1a connected to a vacuum pump P. A holder 3 is disposed in the vacuum chamber 1a for holding a substrate 2 so that the substrate 2 may face downward. The holder 3 is connected to a motor 5 through a driving shaft 4. The motor 5 drives the holder 3 to rotate the substrate 2 within its surface. A heater 6 is built in the holder for heating the substrate 2. The evaporation apparatus 1 further includes an oxidizing gas supply 7 with a nozzle 8 opening just below the holder 3. Then an oxidizing gas is fed such that the partial pressure of oxidizing gas is higher in proximity to the substrate 2. Disposed below the holder 3 are a first evaporation source 9 and a second evaporation source 10. Each of these sources includes a source material container and means for feeding energy for evaporating the source material, e.g., an electron beam generator or resistive heater.

The single crystal substrate 2 was secured to the substrate holder 3 equipped with rotating and heating mechanisms in the vacuum chamber 1a. The vacuum chamber 1a was evacuated to a vacuum of $10^{-6}$ Torr by means of the oil diffusion pump. To protect the cleaned surface of the substrate with silicon oxide, the substrate was rotated at 20 rpm and heated at 600° C. while feeding oxygen toward the substrate from the nozzle 8 at a flow rate of 25 cc/min. The substrate surface was thermally oxidized whereby a silicon oxide layer of about 1 nm thick was formed on the substrate surface.

Next, the substrate was heated at 900° C. and rotated at 20 rpm. While oxygen gas was introduced from the nozzle at a flow rate of 25 cc/min., metallic manganese (Mn) and metallic holmium (Ho) were evaporated from the manganese source 9 and the rare earth element source 10, respectively, at controlled rates to give a Ho/Mn (atomic ratio) of 1.0 and fed to the substrate surface. This step successively performed reduction of the silicon oxide formed in the preceding step and formation of a $HoMnO_3$ film. The $HoMnO_3$ thin film was 15 nm thick.

Figure 5:
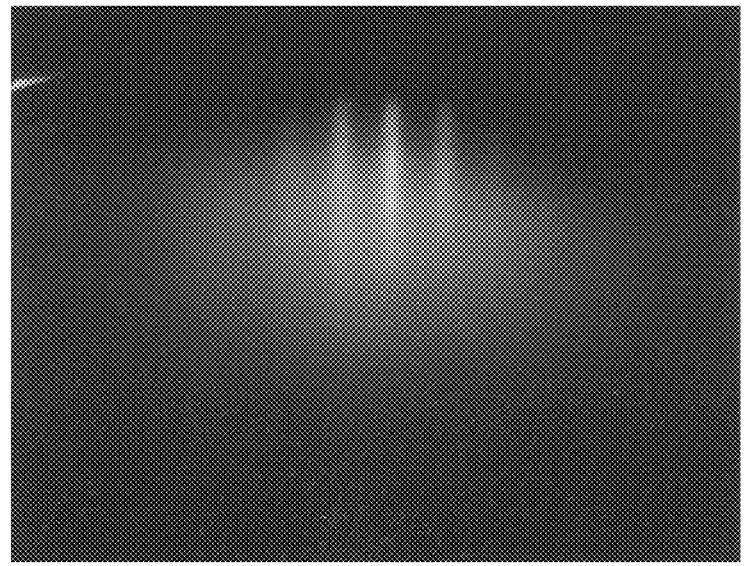
FIG. 5 illustrates a RHEED pattern from a HoMnO$_3$ film formed on a Si (111) substrate as observed when an electron beam is incident from Si single crystal [110] direction.

The $HoMnO_3$ thin film was examined by RHEED analysis. FIG. 5 shows a RHEED pattern of this thin film. The incident direction of an electron beam was [110] direction of the silicon substrate. As seen from FIG. 5, the diffraction pattern of the thin film surface was a fully streaky pattern, which indicated that the $HoMnO_3$ thin film had excellent crystallinity and surface flatness. From this pattern and x-ray diffraction analysis, the $HoMnO_3$ thin film was confirmed to be a hexagonal, c-face oriented, epitaxial film. The thin film was also measured for ten point mean roughness Rz at ten points over substantially the entire surface across a reference length L of 500 nm according to JIS B0610. Rz was 0.50 nm on the average, 0.80 nm at the maximum, and 0.08 nm at the minimum, indicating that the surface was flat on the molecular level.

Next, the substrate having the $HoMnO_3$ thin film formed on its surface was heated at 900° C. and rotated at 20 rpm. While radical nitrogen gas was fed from an electron cyclotron resonance (ECR) nitrogen source toward the substrate at a rate of 25 cc/min., metallic gallium (Ga) was evaporated from its source and fed to the substrate surface. A GaN thin film of 20 nm thick was grown, obtaining a substrate structure for electronic devices.

Figure 6:
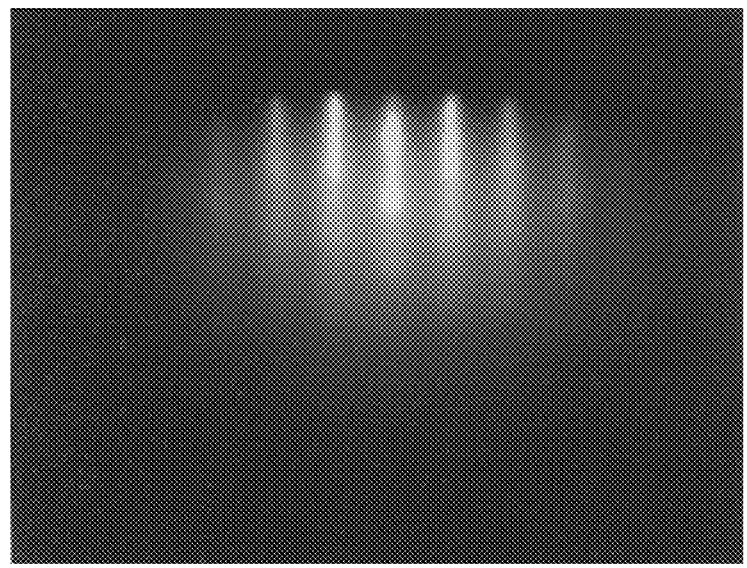
FIG. 6 illustrates a RHEED pattern from a GaN thin film formed on a Si (111) substrate/HoMnO$_3$ (0001) structure as observed when an electron beam is incident from Si single crystal [110] direction.

The GaN thin film was examined by RHEED analysis. FIG. 6 shows a RHEED pattern of this thin film. The incident direction of an electron beam was [110] direction of the silicon substrate. It is seen from FIG. 6 that the GaN thin film had epitaxially grown on the $HoMnO_3$ thin film serving as the buffer layer. From this pattern and x-ray diffraction analysis, the GaN thin film was confirmed to be a hexagonal, c-face oriented, epitaxial film.

Example 2

The Si (111) substrate used herein was the same silicon single crystal wafer as in Example 1.

An electronic device-forming substrate structure including (1) a Si (111) substrate,
(2) an R—Zr family oxide thin film ($ZrO_2$ thin film)
(3) an $AMnO_3$ base thin film ($HoMnO_3$ thin film) and
(4) a surface layer (GaN thin film), the latter three films being stacked on the substrate in the described order, was fabricated by the following procedure.

A $ZrO_2$ thin film was formed in accordance with the procedure described in JP-A 109099/1996 by TDK Corporation and as follows. First, a silicon oxide layer of about 1 nm thick was formed on the substrate surface as in Example 1.

Next, the substrate was heated at 900° C. and rotated at 20 rpm. While oxygen gas was introduced from the nozzle at a flow rate of 25 cc/min., metallic zirconium (Zr) was evaporated from its source and fed to the substrate surface. This step successively performed reduction of the silicon oxide formed in the preceding step and formation of a $ZrO_2$ thin film. The $ZrO_2$ thin film was 10 nm thick.

This $ZrO_2$ thin film was analyzed by x-ray diffractometry. A definite peak corresponding to $ZrO_2$ (111) was observed, indicating that it is a unidirectionally oriented, highly crystalline film. The rocking curve of (111) reflection had a half-value width of 0.7° (the measured value inclusive of reflection on the silicon substrate), confirming excellent orientation. The $ZrO_2$ thin film was also examined by RHEED analysis. The diffraction pattern of the thin film surface was a fully streaky pattern, which indicated that the $ZrO_2$ thin film had excellent crystallinity and surface flatness. The thin film was also measured for ten point mean roughness Rz at ten points over the entire surface across a reference length L of 500 nm according to JIS B0610. Rz was 0.80 nm on the average, 1.00 nm at the maximum, and 0.08 nm at the minimum, indicating that the surface was flat on the molecular level.

Additionally, rare earth oxide thin films were formed instead of the $ZrO_2$ thin film and examined for crystallinity and surface flatness, finding equivalent results to the $ZrO_2$ thin film. Where a thin film of a solid solution of $ZrO_2$ and a rare earth oxide was formed, the film was slightly poor in surface flatness. The $ZrO_2$ thin film and a YSZ (yttrium-stabilized zirconia) thin film were measured for resistivity, finding that the resistivity of the $ZrO_2$ thin film was 5 times higher than that of the YSZ thin film. The $ZrO_2$ thin film is superior in insulation.

Next, a HoMnO$_3$ thin film was formed on the ZrO$_2$ thin film as in Example 1 except that the HoMnO$_3$ thin film was 50 nm thick.

The HoMnO$_3$ thin film was examined by x-ray diffraction and RHEED. This thin film was confirmed to be a hexagonal, c-face oriented, expitaxial film.

Thereafter, a GaN thin film was formed as in Example 1, yielding a substrate structure for electronic devices. The GaN thin film was examined as in Example 1 and confirmed to be a hexagonal, c-face oriented, expitaxial film.

Example 3

There were furnished a silicon (100) substrate of silicon single crystal which was cut so as to make (100) face a surface and mirror polished and a silicon (111) substrate of silicon single crystal which was cut so as to make (111) face a surface and mirror polished. The substrate surfaces were cleaned by etching with a 40% aqueous solution of ammonium fluoride. Each of the single crystal substrates was a circular one having a diameter of 2 inches and a thickness of 300 μm.

An electronic device-forming substrate structure including (1) a Si (100) substrate or Si (111) substrate,
(2) an R—Zr family oxide thin film (ZrO$_2$ thin film)
(3) a metal thin film (Pt thin film),
(4) an AMnO$_3$ base thin film (HoMnO$_3$ thin film), and
(5) a surface layer (GaN thin film), the latter four films being stacked on the substrate in the described order, was fabricated by the following procedure.

The silicon single crystal substrate was surface treated and a ZrO$_2$ thin film was formed as in Example 2.

The ZrO$_2$ thin film was examined by x-ray diffractometry. For the ZrO$_2$ thin film on the Si (100) substrate, a definite peak corresponding to (002) of fluorite structure was observed, confirming that it was a crystal film intensely oriented in a direction reflecting the crystal structure and symmetry of the substrate. The ZrO$_2$ thin film on the Si (111) substrate gave the same results as in Example 2.

Each ZrO$_2$ thin film was also examined by RHEED analysis. The diffraction pattern was a sharp streaky pattern, which indicated that the ZrO$_2$ thin film was single crystal and its surface was flat on the molecular level. Each thin film was also measured for ten point mean roughness Rz at ten points over the entire surface across a reference length L of 500 nm according to JIS B0610. For the ZrO$_2$ (001) thin film on the Si (100) substrate, Rz was 0.70 nm on the average, 0.95 nm at the maximum, and 0.10 nm at the minimum. For the ZrO$_2$ (111) thin film on the Si (111) substrate, Rz was 0.80 nm on the average, 1.00 nm at the maximum, and 0.08 nm at the minimum. These data indicate that both the surfaces were flat on the molecular level.

Next, while each substrate having the ZrO$_2$ thin film on its surface was heated at 700° C. and rotated at 20 rpm, a Pt thin film was formed to a thickness of 100 nm.

When each of the Pt thin films was examined by x-ray diffractometry, a definite peak of Pt (111) was observed both when the Si (100) substrate was used and when the Si (111) substrate was used. It was found that regardless of the substrate used, there was obtained a Pt (111) unidirectionally oriented film which was intensely oriented in a direction reflecting the crystal structure and symmetry.

The Pt thin films were examined by RHEED analysis. The diffraction patterns were sharp and streaky, indicating that both the Pt thin films were epitaxial films.

Additionally, rare earth oxide thin films were formed instead of the ZrO$_2$ thin film. The rare earth oxide thin films became epitaxial films of (111) orientation whether the substrate was the Si (100) substrate or the Si (111) substrate and their surface flatness was equivalent to that of the ZrO$_2$ thin film. Platinum was deposited on these rare earth oxide thin films under the same conditions as above, obtaining Pt (111) thin films having equivalent crystallinity and surface flatness to those of the Pt thin film on the ZrO$_2$ thin film.

Next, a HoMnO$_3$ thin films were formed on the Pt thin films as in Example 1 except that the HoMnO$_3$ thin film was 300 nm thick.

The HoMnO$_3$ thin films were examined by x-ray diffraction. Only the hexagonal c-face reflection peak was detected whether the Si (100) substrate or the Si (111) substrate was used, indicating that the films were unidirectionally oriented. The RHEED diffraction patterns from both the thin films were streaky, indicating that both the thin films were epitaxial films.

When a thin film of a solid solution consisting of ZrO$_3$ and a rare earth oxide was formed instead of the ZrO$_2$ thin film, it was somewhat poor in surface flatness. Where another metal thin film such as an Ir thin film was interposed instead of the Pt thin film, there were obtained equivalent results to the Pt thin film.

Thereafter, GaN thin films were formed as in Example 1, yielding electronic device-forming substrate structures. Each GaN thin film was examined as in Example 1 and confirmed to be a hexagonal, c-face oriented, expitaxial film.

Example 4

Electronic device-forming substrate structures were fabricated as in Example 3 except that the AMnO$_3$ base thin film (HoMnO$_3$ thin film) on the metal thin film was replaced by an R—Zr family oxide thin film (ZrO$_2$ thin film) of 30 nm thick. That is, the metal thin film was interleaved between the R—Zr family oxide thin films.

Of these electronic device-forming substrate structures, those using the Si (100) substrate had the relationships: Si (100)//GaN (0001) and Si (110)//GaN (1–100) as confirmed by RHEED and x-ray diffraction. That is, it was confirmed that the cleavage plane of the silicon substrate was coincident with the cleavage plane of the GaN thin film.

Example 5

The Si (111) substrate used herein was the same silicon single crystal wafer as in Example 1.

An electronic device-forming substrate structure including (1) a Si (111) substrate,
(2) an R—Zr family oxide thin film (ZrO$_2$ thin film), and
(3) a surface layer (AlN thin film), the latter two films being stacked on the substrate in the described order, was fabricated by the following procedure.

The silicon single crystal substrate was surface treated and a ZrO$_2$ thin film was formed as in Example 2.

On the ZrO$_2$ thin film, an AlN thin film of 2 μm thick was formed. In forming the AlN thin film, RF magnetron sputtering was carried out in a nitrogen atmosphere using a target of metallic aluminum. The sputtering conditions included a substrate temperature of 600° C., a N$_2$ gas pressure of 0.25 Pa, and an RF power of 800 W.

The AlN thin film was examined by x-ray diffractometry. A definite peak of AlN (0002) was observed, indicating that it was a unidirectionally oriented, wurtzite type, highly crystalline film. The rocking curve of (0002) reflection had a half-value width of 1.9°, confirming excellent orientation.

Figure 7:
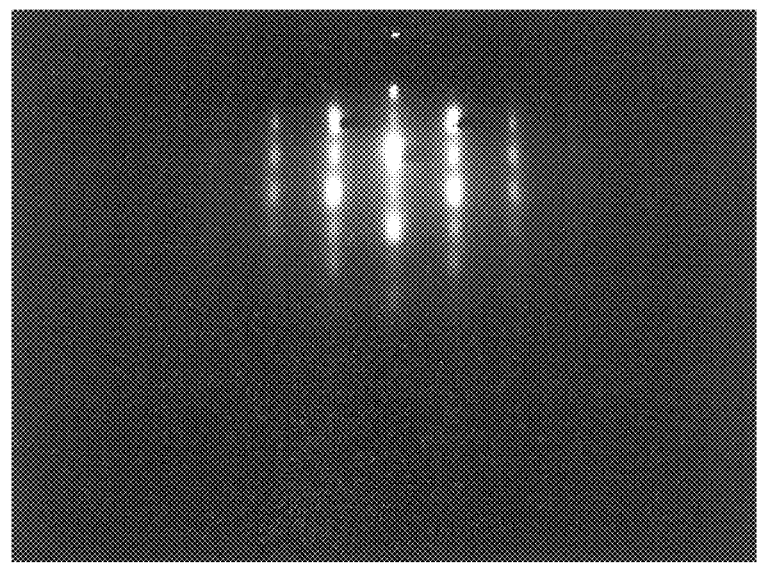
FIG. 7 illustrates a RHEED pattern from a AlN thin film formed on a Si (111) substrate/ZrO$_2$ (111) thin film.
Figure 8:
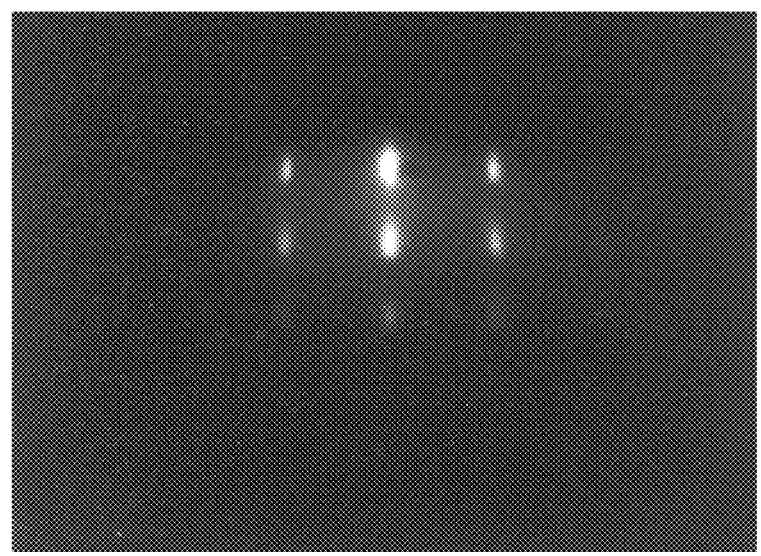
FIG. 8 illustrates a RHEED pattern from a AlN thin film formed on a Si (111) substrate/ZrO$_2$ (111) thin film, the incident direction of an electron beam being rotated 30° from the direction of FIG. 7 within the plane of the substrate.

Also the AlN thin film was examined by RHEED. The RHEED diffraction pattern was such that the patterns of FIGS. 7 and 8 alternately appeared at every rotation angle of 30° when the substrate was rotated in-plane. It is evident from this pattern that the AlN thin film was an epitaxial film.

The AlN thin film was also measured for ten point mean roughness Rz at ten points over substantially the entire surface across a reference length L of 500 nm according to JIS B0610. Rz was 2.5 nm on the average, 5 nm at the maximum, and 1.0 nm at the minimum, indicating that the surface was flat.

Example 6

The Si (111) substrate used herein was the same silicon single crystal wafer as in Example 1.

An electronic device-forming substrate structure including (1) a Si (111) substrate, (2) an R—Zr family oxide thin film (ZrO$_2$ thin film)

(3) a metal thin film (Pt thin film) and (4) a surface layer (ZnO thin film), the latter three films being stacked on the substrate in the described order, was fabricated by the following procedure.

The procedure of Example 4 was followed until the ZrO$_2$ thin film was formed. Next, while each substrate having the ZrO$_2$ thin film on its surface was heated at 500° C. and rotated at 20 rpm, a Pt thin film was formed to a thickness of 100 nm.

When each of the Pt thin films was examined by x-ray diffractometry, a definite peak of Pt (111) was observed, indicating that it was a unidirectionally oriented, highly crystalline film. The rocking curve of (111) reflection had a half-value width of 0.78°, confirming excellent orientation. The Pt thin films were examined by RHEED analysis. The diffraction patterns were fully streaky, indicating that the Pt thin films were improved in crystallinity and surface flatness.

Next, a ZnO thin film of 1 μm thick was formed on the Pt thin film. In forming the ZnO thin film, RF magnetron sputtering was carried out in an atmosphere of Ar+O$_2$ using a target of ZnO. The sputtering conditions included a substrate temperature of 500° C., a O$_2$/(Ar+O$_2$) proportion of 10%, a gas pressure of 0.4 Pa, and an RF power of 150 W.

The ZnO thin film was examined by x-ray diffractometry. A definite peak of ZnO (0002) was observed, indicating that it was a unidirectionally oriented, wurtzite type, highly crystalline film. The rocking curve of (0002) reflection had a half-value width of 0.99°, confirming excellent orientation.

Figure 9:
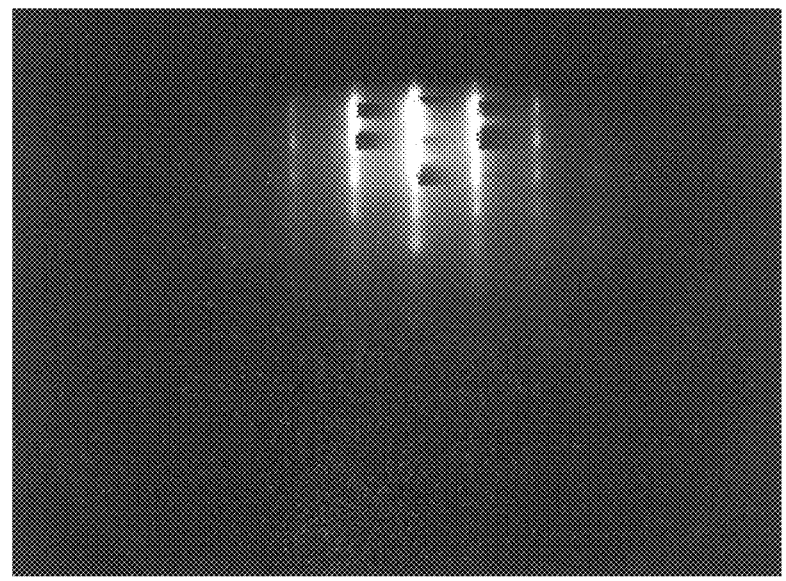
FIG. 9 illustrates a RHEED pattern from a ZnO thin film formed on a Si (111) substrate/ZrO$_2$ (111) thin film/Pt (111) thin film.
Figure 10:
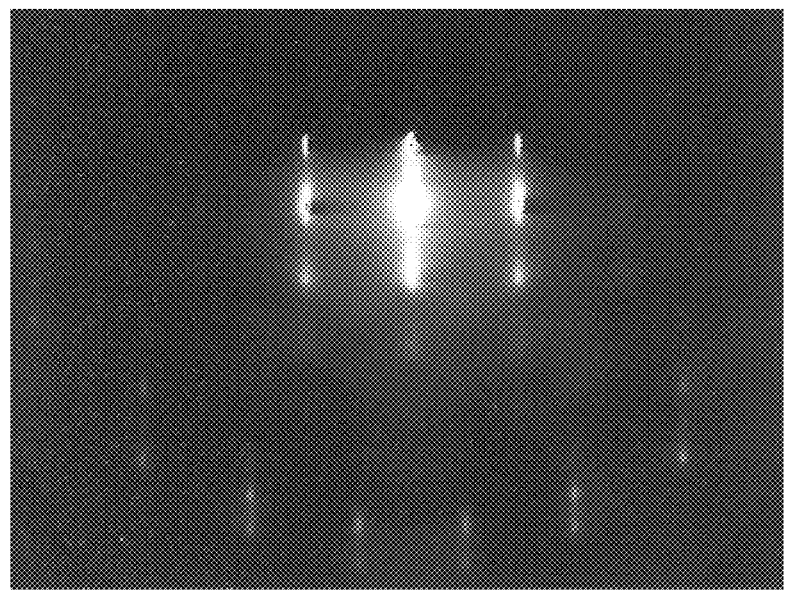
FIG. 10 illustrates a RHEED pattern from a ZnO thin film formed on a Si (111) substrate/ZrO$_2$ (111) thin film/Pt (111) thin film, the incident direction of an electron beam being rotated 30° from the direction of FIG. 9 within the plane of the substrate.

Also the ZnO thin film was examined by RHEED. The RHEED diffraction pattern was such that the patterns of FIGS. 9 and 10 alternately appeared at every rotation angle of 30° when the substrate was rotated in-plane. It is evident from this pattern that the ZnO thin film was an epitaxial film.

The ZnO thin film was also measured for ten point mean roughness Rz at ten points over substantially the entire surface across a reference length L of 500 nm according to JIS B0610. Rz was 8.5 nm on the average, 10 nm at the maximum, and 2 nm at the minimum, indicating that the surface was flat.

Example 7

The Si (100) substrate and Si (111) substrate used were the same as in Example 3.

Electronic device-forming substrate structures including (1) a Si (100) substrate or Si (111) substrate, (2) an R—Zr family oxide thin film (Pr$_2$O$_3$ thin film), and (3) a surface layer (GaN thin film), the latter two films being stacked on the substrate in the described order, was fabricated by the following procedure.

As in Example 1, a silicon oxide layer was formed on the surface of each substrate. Then the procedure of Example 1 was followed except that metallic praseodymium (Pr) was used instead of metallic zirconium, forming a Pr$_2$O$_3$ thin film of 10 nm thick.

Each Pr$_2$O$_3$ thin film was examined by x-ray diffractometry. For the Pr$_2$O$_3$ thin film on the Si (100) substrate, a definite peak corresponding to (222) of rare earth C-type structure was observed, confirming that it was an intensely oriented crystal film. For the Pr$_2$O$_3$ thin film on the Si (111) substrate, a definite (222) peak was similarly observed, confirming that it was a crystal film intensely oriented in a direction reflecting the crystal structure and symmetry of the substrate.

Each Pr$_2$O$_3$ thin film was also examined by RHEED analysis. The diffraction pattern was a sharp streaky pattern, which indicated that the Pr$_2$O$_3$ thin film was single crystal and its surface was flat on the atomic level. Each thin film was also measured for ten point mean roughness Rz at ten points over substantially the entire surface across a reference length L of 500 nm according to JIS B0610. For the Pr$_2$O$_3$ (111) thin film on the Si (100) substrate, Rz was 0.70 nm on the average, 0.95 nm at the maximum, and 0.10 nm at the minimum. For the Pr$_2$O$_3$ (111) thin film on the Si (111) substrate, Rz was 0.80 nm on the average, 1.00 nm at the maximum, and 0.08 nm at the minimum. These data indicated that both the surfaces were flat on the molecular level.

On each Pr$_2$O$_3$ thin film, a GaN thin film of 1 μm thick was formed. In forming the GaN thin film, RF magnetron sputtering was carried out in a nitrogen atmosphere using a target of metallic gallium. The sputtering conditions included a substrate temperature of 500° C., a N$_2$ gas pressure of 0.25 Pa, and an RF power of 300 W.

The GaN thin film on the Si (111) substrate was examined by x-ray diffractometry. A definite peak of GaN (0001) was observed, indicating that it was a unidirectionally oriented, wurtzite type, highly crystalline film. The rocking curve of (0001) reflection had a half-value width of 1.9° (the measured value inclusive of reflection on the silicon substrate), confirming excellent orientation.

Figure 11:
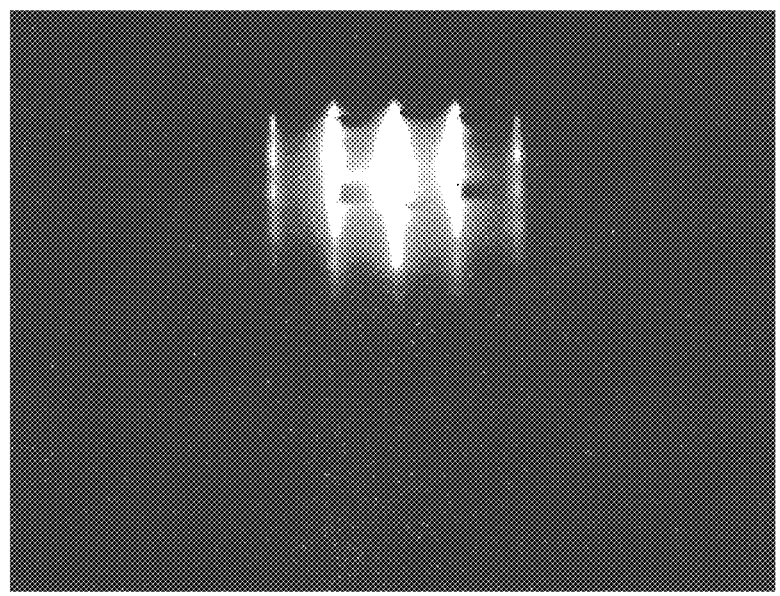
FIG. 11 illustrates a RHEED pattern from a GaN thin film formed on a Si (111) substrate/Pr$_2$O$_3$ (111) thin film.
Figure 12:
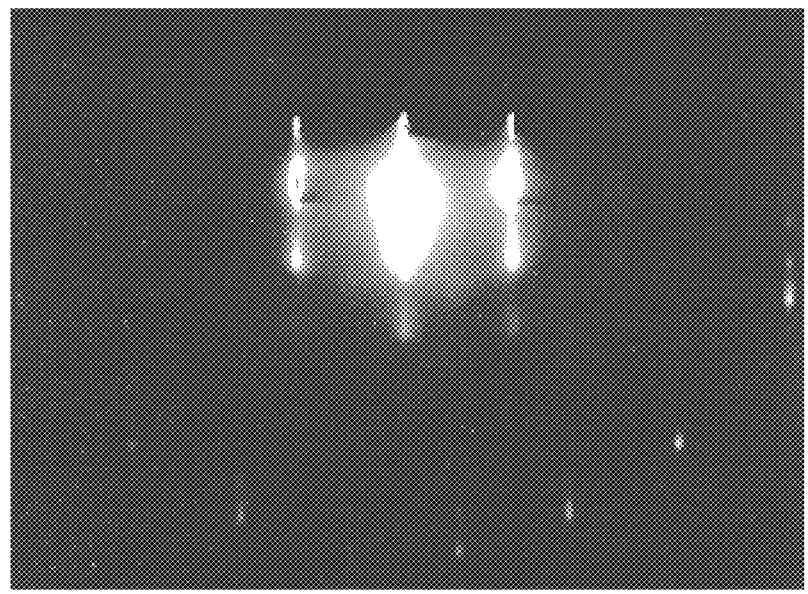
FIG. 12 illustrates a RHEED pattern from a GaN thin film formed on a Si (111) substrate/Pr$_2$O$_3$ (111) thin film, the incident direction of an electron beam being rotated 30° from the direction of FIG. 11 within the plane of the substrate.

Also the GaN thin film on the Si (111) substrate was examined by RHEED. The RHEED diffraction pattern was such that the patterns of FIGS. 11 and 12 alternately appeared at every rotation angle of 30° when the substrate was rotated in-plane. It is evident from this pattern that the GaN thin film was an epitaxial film.

The GaN thin film on the Si (111) substrate was also measured for ten point mean roughness Rz at ten points over substantially the entire surface across a reference length L of 500 nm according to JIS B0610. Rz was 0.9 nm on the average, 1.5 nm at the maximum, and 0.5 nm at the minimum, indicating that the surface was flat.

Equivalent results were obtained when the GaN thin film on the Si (100) substrate were also examined by x-ray diffractometry and RHEED and for surface flatness.

Of these electronic device-forming substrate structures, those using the Si (100) substrate had the relationships: Si (100)//GaN (0001) and Si (110)//GaN (1–100) as confirmed by RHEED and x-ray diffraction. That is, it was confirmed that the cleavage plane of the silicon substrate was coincident with the cleavage plane of the GaN thin film.

Example 8

The Si (111) substrate used herein was the same silicon single crystal wafer as in Example 1.

An electronic device-forming substrate structure including (1) a Si (111) substrate,
(2) a NaCl type nitride thin film (ZrN thin film) and
(3) a surface layer (InN thin film), the latter two films being stacked on the substrate in the described order, was fabricated by the following procedure.

The evaporation apparatus shown in FIG. 4 was used. The vacuum chamber was evacuated to a vacuum of $10^{-6}$ Torr by means of an oil diffusion pump. The substrate was rotated at 20 rpm and heated at 900° C. while feeding nitrogen gas toward the substrate from the nozzle at a flow rate of 10 cc/min. Metallic zirconium was evaporated from its source and fed to the substrate surface, forming a ZrN thin film of 10 nm thick.

When the ZrN thin film was examined by x-ray diffractometry, a definite peak of ZrN (111) was observed, indicating that it was a unidirectionally oriented, highly crystalline film. The rocking curve of (111) reflection had a half-value width of 0.78°, confirming excellent orientation. The ZrN thin films were also examined by RHEED analysis. The diffraction pattern of the thin film surface was streaky, indicating that the ZrN thin films were improved in crystallinity and surface flatness.

Next, an InN thin film of 1 $\mu$m was formed on the ZrN thin film. In forming the InN thin film, RF magnetron sputtering was carried out in a nitrogen atmosphere using a target of metallic indium. The sputtering conditions included a substrate temperature of 600° C., a $N_2$ gas pressure of 0.25 Pa, and an RF power of 300 W.

The InN thin film was examined by x-ray diffractometry. A definite peak of InN (0002) was observed, indicating that it was a unidirectionally oriented, wurtzite type, highly crystalline film. The rocking curve of (0002) reflection had a half-value width of 0.99°, confirming excellent orientation.

Figure 13:
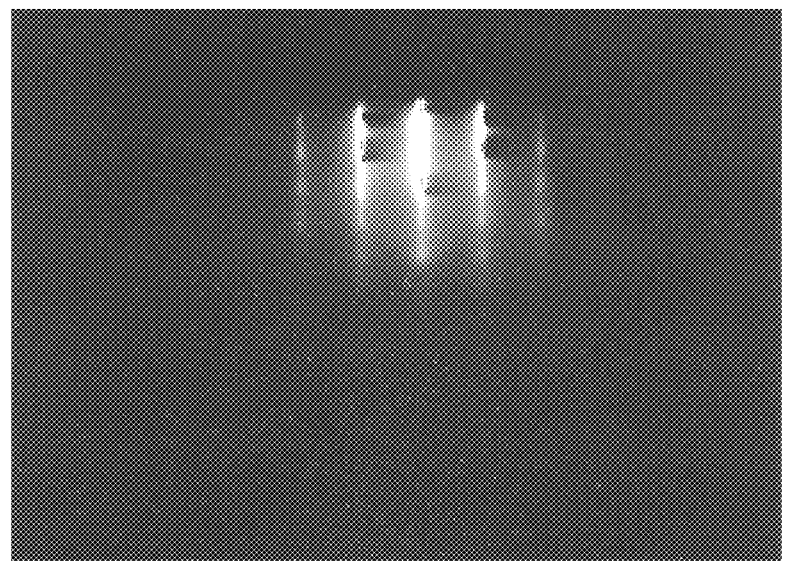
FIG. 13 illustrates a RHEED pattern from a InN thin film formed on a Si (111) substrate/ZrN (111) thin film.
Figure 14:
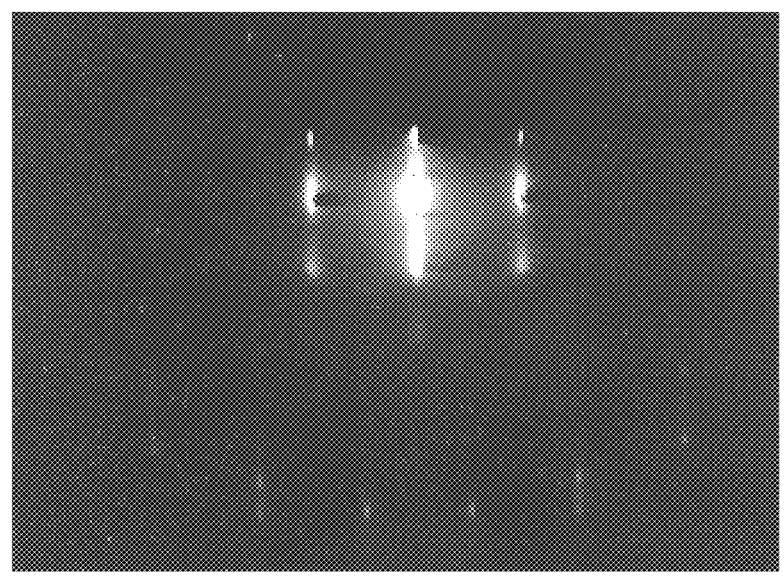
FIG. 14 illustrates a RHEED pattern from a InN thin film formed on a Si (111) substrate/ZrN (111) thin film, the incident direction of an electron beam being rotated 30° from the direction of FIG. 13 within the plane of the substrate.

Also the InN thin film was examined by RHEED. The RHEED diffraction pattern was such that the patterns of FIGS. 13 and 14 alternately appeared at every rotation angle of 30° when the substrate was rotated in-plane. It is evident from this pattern that the InN thin film was an epitaxial film.

Example 9

The Si (111) substrate used herein was the same silicon single crystal wafer as in Example 1.

An electronic device-forming substrate structure including (1) a Si (111) substrate,
(2) an $AlO_x$ base thin film ($AlO_x$ thin film) and
(3) a surface layer (GaN thin film), the latter two films being stacked on the substrate in the described order, was fabricated by the following procedure.

First, a silicon oxide layer of about 1 nm thick was formed on the substrate surface as in Example 1.

Next, the substrate was heated at 900° C. and rotated at 20 rpm while feeding oxygen gas toward the substrate from the nozzle at a flow rate of 25 cc/min. Metallic aluminum was evaporated from its source and fed to the substrate surface. This step successively performed reduction of the silicon oxide formed in the preceding step and formation of a $AlO_x$ film. The $AlO_x$ thin film was 10 nm thick.

Examination of the $AlO_x$ thin film by x-ray diffractometry confirmed that it was a (111) oriented film having a $\gamma$-$Al_2O_3$ type crystal structure.

Figure 15:
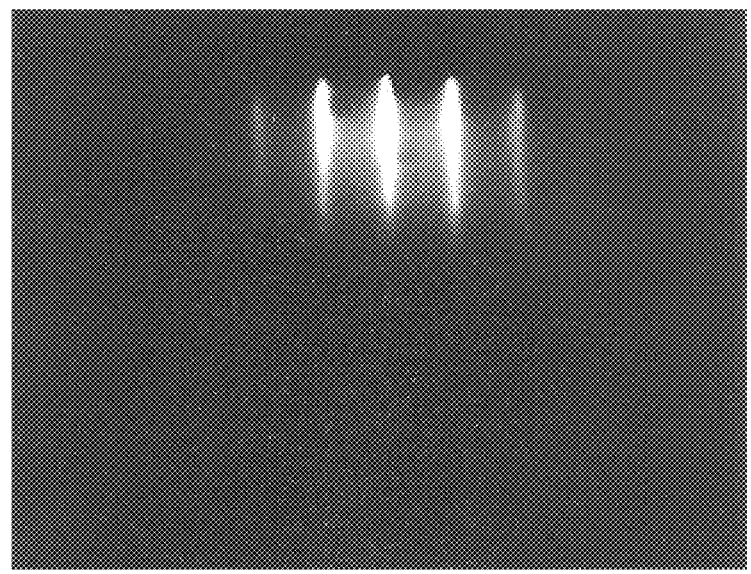
FIG. 15 illustrates a RHEED pattern from a AlO$_x$ thin film formed on a Si (111) substrate.

The $AlO_x$ thin film was also examined by RHEED analysis. The result is shown in FIG. 15. The diffraction pattern of the thin film surface was fully streaky, indicating that the $AlO_x$ thin film was improved in crystallinity and surface flatness. The $AlO_x$ thin film was also measured for ten point mean roughness Rz at ten points over substantially the entire surface across a reference length L of 500 nm according to JIS B0610. Rz was 0.70 nm on the average, 1.00 nm at the maximum, and 0.08 nm at the minimum, indicating that the surface was flat on the molecular level.

Next, a GaN thin film of 2 $\mu$m thick was formed on the $AlO_x$ thin film. In forming the GaN thin film, RF magnetron sputtering was carried out in a nitrogen atmosphere using a target of metallic gallium. The sputtering conditions included a substrate temperature of 600° C., a $N_2$ gas pressure of 0.25 Pa, and an RF power of 800 W.

Figure 16:
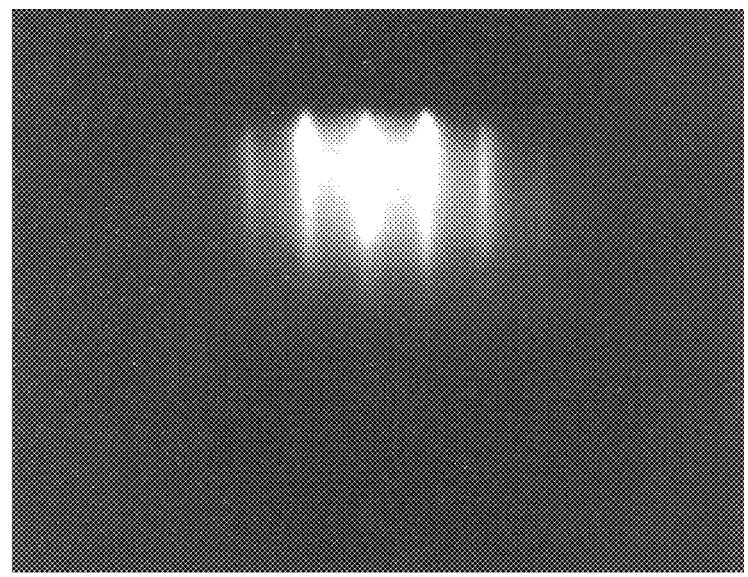
FIG. 16 illustrates a RHEED pattern from a GaN thin film formed on a Si (111) substrate/AlO$_x$ (111) thin film.
Figure 17:
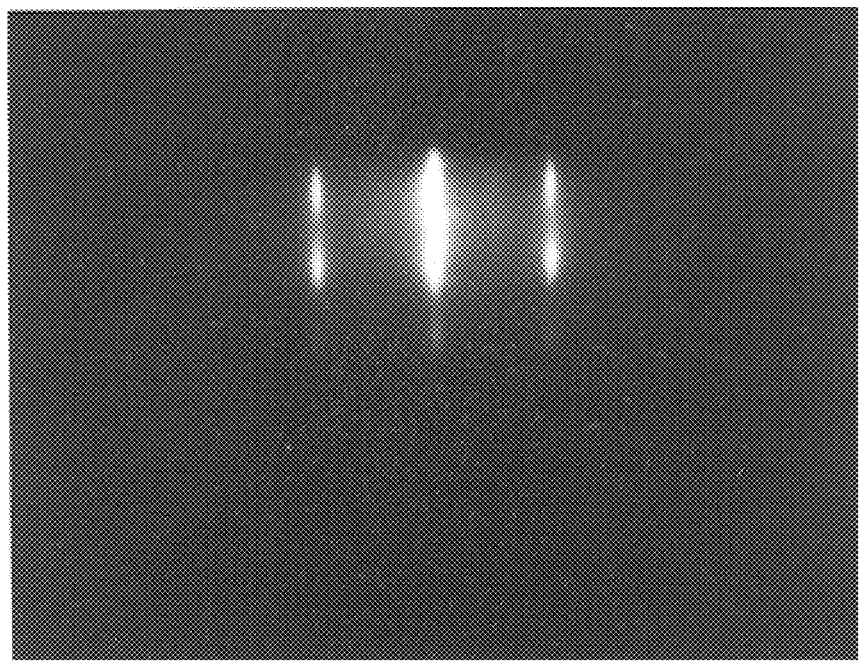
FIG. 17 illustrates a RHEED pattern from a GaN thin film formed on a Si (111) substrate/AlO$_x$ (111) thin film, the incident direction of an electron beam being rotated 30° from the direction of FIG. 16 within the plane of the substrate.

The GaN thin film was examined by RHEED. The RHEED diffraction pattern was such that the patterns of FIGS. 16 and 17 alternately appeared at every rotation angle of 30° when the substrate was rotated in-plane. It is evident from this pattern that the GaN thin film was an epitaxial film.

The GaN thin film was also measured for ten point mean roughness Rz at ten points over substantially the entire surface across a reference length L of 500 nm according to JIS B0610. Rz was 1.5 nm on the average, 2 nm at the maximum, and 0.7 nm at the minimum, indicating that the surface was flat.

Example 10

Electronic device-forming substrate structures were fabricated by depositing thin films in the following order. Epitaxial films of the crystal orientation shown below were obtained. It is noted that the (0001) oriented GaInAlN thin films shown below are AlN (0001) thin films, GaN (0001) thin films, and InN (0001) thin films.

The formation of ZnO (0001) thin films was carried out by evaporation or sputtering. In the evaporation method, the substrate was heated at 600° C. and rotated at 20 rpm while feeding oxygen gas from an ECR radical oxygen source at a rate of 25 cc/min. Metallic zinc was evaporated from its source and fed to the substrate surface, forming a ZnO film. The conditions for sputtering were the same as in Example 6.

Also the formation of (0001) oriented GaInAlN thin films was carried out by evaporation or sputtering. In the evaporation method, the substrate was heated at 600° C. and rotated at 20 rpm while feeding nitrogen gas from an ECR radical nitrogen source at a rate of 25 cc/min. A metal was evaporated from its source and fed to the substrate surface, forming a film. The conditions for sputtering were the same as in Examples 5, 7 and 8.

The remaining thin films were formed as in the foregoing Examples.

Sample 10-1
(1) Si (111) substrate
(2) $HoMnO_3$ (0001) thin film
(3) Pt (111) thin film
(4) (0001) oriented GaInAlN thin film Sample 10-2
(1) Si (111) substrate
(2) $ZrO_2$ (111) thin film
(3) $HoMnO_3$ (0001) thin film
(4) Pt (111) thin film
(5) $HoMnO_3$ (0001) thin film
(6) (0001) oriented GaInAlN thin film Sample 10-3
(1) Si (111) substrate (2) ZrO$_2$ (111) thin film
(3) Pt (111) thin film
(4) HoMnO$_3$ (0001) thin film
(5) (0001) oriented GaInAlN thin film Sample 10-4
(1) Si (111) substrate
(2) ZrO$_2$ (111) thin film
(3) Pt (111) thin film
(4) ZrO$_2$ (111) thin film
(5) HoMnO$_3$ (0001) thin film
(6) (0001) oriented GaInAlN thin film Sample 10-5
(1) Si (111) substrate
(2) Sc$_2$O$_3$ (111) thin film
(3) (0001) oriented GaInAlN thin film Sample 10-6
(1) Si (111) substrate
(2) ZrO$_2$ (111) thin film
(3) Pt (111) thin film
(4) (0001) oriented GaInAlN thin film Sample 10-7
(1) Si (111) substrate
(2) Lu$_3$O$_3$ (111) thin film
(3) ZnO (0001) thin film or (0001) oriented GaInAlN thin film Sample 10-8
(1) Si (111) substrate
(2) ZrO$_2$ (111) thin film
(3) ZnO (0001) thin film or (0001) oriented GaInAlN thin film
(4) Pt (111) thin film
(5) (0001) oriented GaInAlN thin film Sample 10-9
(1) Si (111) substrate
(2) ZrO$_2$ (111) thin film
(3) ZnO (0001) thin film or (0001) oriented GaInAlN thin film
(4) Pt (111) thin film
(5) ZnO (0001) thin film or (0001) oriented GaInAlN thin film Sample 10-10
(1) Si (111) substrate
(2) ZrO$_2$ (111) thin film
(3) Pt (111) thin film
(4) ZrO$_2$ (111) thin film
(5) ZnO (0001) thin film or (0001) oriented GaInAlN thin film The effectiveness of the invention is evident from the results of the foregoing Examples.

Japanese Patent Application Nos. 202409/1997 and 16368/1998 are herein incorporated by reference.

Reasonable modifications and variations are possible from the foregoing disclosure without departing from either the spirit or scope of the present invention as defined by the claims.

We claim:

1. A substrate structure for electronic devices, comprising a substrate having a surface, at least the substrate surface formed of single crystal silicon, a buffer layer on the substrate surface, and a surface layer on the buffer layer, said buffer layer being constructed by an oxide buffer layer and/or a nitride buffer layer, said oxide buffer layer including an R—Zr family oxide thin film which is an epitaxial film comprising an oxide of scandium, yttrium or a rare earth element and/or zirconium oxide, an AMnO$_3$ base thin film which is an epitaxial film comprising A, manganese and oxygen wherein A is scandium, yttrium or a rare earth element and having a crystal structure of hexagonal YMnO$_3$ type, an AlO$_x$ base thin film which is an epitaxial film comprising aluminum and oxygen, or a combination of said R—Zr family oxide thin film with said AMnO$_3$ base thin film and/or said AlO$_x$ base thin film, said nitride buffer layer including a NaCl type nitride thin film which is an epitaxial film comprising at least one of titanium nitride, niobium nitride, tantalum nitride and zirconium nitride, said surface layer including an oxide epitaxial film having a wurtzite type crystal structure and/or a nitride epitaxial film having a wurtzite type crystal structure.

2. The substrate structure of claim 1 wherein said surface layer includes an AlGaInN base thin film comprising nitrogen and at least one of aluminum, gallium, and indium, a ZnO base thin film comprising zinc oxide, or a combination of said AlGaInN base thin film with said ZnO base thin film.

3. The substrate structure of claim 2 wherein said AlGaInN base thin film is a semiconductor.

4. The substrate structure of claim 1 wherein said substrate has a silicon (100) face at its surface, and a silicon (110) face of said substrate is parallel to a (1–100) face of said surface layer.

5. The substrate structure of claim 1 further comprising a metal thin film on said surface layer, within said surface layer, between said buffer layer and said surface layer, or within said buffer layer, said metal thin film being an epitaxial film comprising at least one of platinum, iridium, osmium, rhenium, palladium, rhodium and ruthenium.

6. The substrate structure of claim 5 wherein said metal thin film has a (111) or (0001) face oriented parallel to the substrate surface.

* * * * *